(12) United States Patent
Daicho et al.

(10) Patent No.: US 8,187,495 B2
(45) Date of Patent: *May 29, 2012

(54) LIGHT EMITTING DEVICE

(75) Inventors: Hisayoshi Daicho, Shizuoka (JP);
Takeshi Iwasaki, Shizuoka (JP);
Kiminori Enomoto, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 988 days.

This patent is subject to a terminal disclaimer.

(21) Appl. No.: 12/172,428

(22) Filed: Jul. 14, 2008

(65) Prior Publication Data

US 2009/0015138 A1  Jan. 15, 2009

(30) Foreign Application Priority Data

Jul. 12, 2007  (JP) ............................. P.2007-183062
Jun. 19, 2008  (JP) ............................. P.2008-159817

(51) Int. Cl.
*C09K 11/08* (2006.01)
*C09K 11/61* (2006.01)
*C09K 11/66* (2006.01)

(52) U.S. Cl. .... 252/301.4 H; 252/301.4 F; 252/301.6 F; 313/486

(58) Field of Classification Search ................ 313/486, 313/487, 503; 257/98; 252/301.4 H, 301.4 R, 252/301.6 F, 301.6 R See application file for complete search history.

(56) References Cited

U.S. PATENT DOCUMENTS

| 7,704,411 B2 * | 4/2010 | Daicho et al. ......... 252/301.4 R |
| 2006/0113553 A1 | 6/2006 | Srivastava et al. |
| 2006/0214175 A1 * | 9/2006 | Tian ................................. 257/98 |
| 2006/0221635 A1 * | 10/2006 | Sohn et al. ..................... 362/612 |
| 2007/0145879 A1 * | 6/2007 | Abramov et al. ............. 313/483 |

FOREIGN PATENT DOCUMENTS

| JP | 2003-110150 A | * | 4/2003 |
| JP | 3503139 B2 | | 12/2003 |
| JP | 2004-2554 A | | 1/2004 |
| JP | 2005-126577 A | | 5/2005 |
| JP | 2007-145958 A | | 6/2007 |

OTHER PUBLICATIONS

Extended European Search Report issued Jan. 26, 2009.

* cited by examiner

*Primary Examiner* — Jerry Lorengo
*Assistant Examiner* — Lynne Edmondson
(74) *Attorney, Agent, or Firm* — Sughrue Mion, PLLC

(57) ABSTRACT

A light emitting device is provided. The light emitting device includes a light emitting element that emits ultraviolet light or short-wavelength visible light; and at least one phosphor that is excited by the ultraviolet light or short-wavelength visible light to emit visible light. The at least one phosphor includes a first phosphor including a composition represented by the formula: $M^1O_2 \cdot aM^2O \cdot bM^3X_2 : M^4$, where $M^1$ is at least one element selected from the group consisting of Si, Ge, Ti, Zr, and Sn; $M^2$ is at least one element selected from the group consisting of Mg, Ca, Sr, Ba, and Zn; $M^3$ is at least one element selected from the group consisting of Mg, Ca, Sr, Ba, and Zn; X is at least one halogen element; $M^4$ is at least one element essentially including $Eu^{2+}$ selected from the group consisting of rare-earth elements and Mn; a is in the range of $0.1 \leq a \leq 1.3$; and b is in the range of $0.1 \leq b \leq 0.25$.

16 Claims, 11 Drawing Sheets

LIGHT EMITTING DEVICE

This application claims priority from Japanese Patent Applications No. 2007-183062, filed on Jul. 12, 2007, and No. 2008-159817, filed on Jun. 19, 2008, the entire contents of which are hereby incorporated by reference.

BACKGROUND OF THE INVENTION

1. Technical Field

Devices and compositions consistent with the present invention relate to a light emitting device using a phosphor, and more particularly, to a light emitting device having a high color rendering property and high luminous flux by using phosphors that are efficiently excited by ultraviolet light or short-wavelength visible light to emit light.

2. Description of the Related Art

Various related art light emitting devices can provide light of desired colors by combining a light emitting element and a phosphor. The phosphor is excited by light generated by the light emitting element and then emits light of a wavelength band different from that of the light emitting element.

Particularly, a related art light emitting device that provides white light by combining a semiconductor light emitting element, such as a light emitting diode (LED) or a laser diode (LD), which emits ultraviolet light or short-wavelength visible light, with a phosphor that uses the semiconductor light emitting element as an excitation light source has been proposed as a white light emitting device that is durable and consumes little power.

Various such related art white light emitting devices have been proposed, such as (1) a related art device combining an LED that emits blue light and a phosphor that is excited by the blue light and then emits yellow light, and (2) a related art device combining a plurality of LEDS that emit violet light or ultraviolet light and phosphors that emit light with colors of red, green, blue, yellow, and the like. (see e.g., Japanese Patent No. 3503139; Japanese Unexamined Patent Application Publication No. 2005-126577; and Japanese Unexamined Patent Application Publication No. 2003-110150).

However, the related art white light emitting devices described above have a few disadvantages. For example, in the related art white light emitting device (1), there is little light of a wavelength band between the blue color and the yellow color, and a color rendering property is small because there is little light of a red region obtained from the phosphor. The white light is obtained by mixing the light of the LED and the light of the phosphor. Accordingly, for example, when the phosphor is not uniformly applied in a production process of the related art white light emitting device, balance in the amount of light emitted by the LED and the phosphor is reduced. Therefore, non-uniformity occurs also in the spectrum of the obtained white light.

The related art white light emitting device (2) is good in a color rendering property, but a phosphor having a strong excitation band in an ultraviolet light region or a short-wavelength visible light region has not been found, and thus it has been difficult to realize a high-power white light emitting device.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any of the problems described above.

According to one or more aspects of the present invention, there is provided a light emitting device. The light emitting device includes a light emitting element that emits ultraviolet light or short-wavelength visible light; and at least one phosphor that is excited by the ultraviolet light or short-wavelength visible light to emit visible light. The at least one phosphor includes a first phosphor including a composition represented by the formula: $M^1O_2.aM^2O.bM^3X_2:M^4$ wherein $M^1$ is at least one element selected from the group consisting of Si, Ge, Ti, Zr, and Sn; $M^2$ is at least one element selected from the group consisting of Mg, Ca, Sr, Ba, and Zn; $M^3$ is at least one element selected from the group consisting of Mg, Ca, Sr, Ba, and Zn; X is at least one halogen element; $M^4$ is at least one element essentially including $Eu^{2+}$ selected from the group consisting of rare-earth elements and Mn; a is in the range of $0.1 \leq a \leq 1.3$; and b is in the range of $0.1 \leq b \leq 0.25$.

According to one or more aspects of the present invention, there is provided a light emitting device. The light emitting device includes a light emitting element that emits ultraviolet light or short-wavelength visible light; and at least two phosphors that are excited by the ultraviolet light or short-wavelength visible light to emit first visible light, wherein the first visible light emitted by the phosphors are in a complementary-color relation with each other and white light is obtained by adding and mixing colors of the first visible light. The at least two phosphors comprises a first phosphor comprising a composition represented by the formula: $M^1O_2.aM^2O.bM^3X_2:M^4$ wherein $M^1$ is at least one element selected from the group consisting of Si, Ge, Ti, Zr, and Sn; $M^2$ is at least one element selected from the group consisting of Mg, Ca, Sr, Ba, and Zn; $M^3$ is at least one element selected from the group consisting of Mg, Ca, Sr, Ba, and Zn; X is at least one halogen element; $M^4$ is at least one element essentially including $Eu^{2+}$ selected from the group consisting of rare-earth elements and Mn; a is in the range of $0.1 \leq a \leq 1.3$; and b is in the range of $0.1 \leq b \leq 0.25$; and a second phosphor that emits second visible light that is in a complementary-color relation with the first visible light emitted from the first phosphor.

In the first phosphor, it is advantageous that when the content of $M^4$ in the formula is c (mole ratio), c is in the range of $0.03 < c/(a+c) < 0.8$.

In the first phosphor, it is advantageous that $M^1$ in the formula essentially includes at least Si, and a ratio of Si is 80 mol % or more; $M^2$ in the formula essentially includes at least one of Ca and Sr, and a ratio of at least one of Ca and Sr is 60 mol % or more; $M^3$ in the formula essentially includes at least Sr, and a ratio of Sr is 30 mol % or more; and X in the formula essentially includes at least Cl, and a ratio of Cl is 50 mol % or more.

In the first phosphor, it is advantageous that a is in the range of $0.3 \leq a \leq 1.2$, b is in the range of $0.1 \leq b \leq 0.2$, and the content c of $M^4$ is in the range of $0.05 \leq c/(a+c) \leq 0.5$.

The method for producing the first phosphor is not particularly limited. However, the first phosphor may be obtained by mixing and baking starting materials, in which the starting materials include at least compounds represented by the formulas (1) to (4):

(1) $M^1O_2$
(2) $M^2O$
(3) $M^3X_2$
(4) $M^4$ where mole ratios of the compounds are in the range of (1):(2)=1:0.1 to 10; (2):(3)=1:0.2 to 12.0; and (2):(4)=1:0.05 to 4.0, respectively, where $M^1$ is at least one element selected from the group consisting of Si, Ge, Ti, Zr, and Sn; $M^2$ is at least one element selected from the group consisting of Mg, Ca, Sr, Ba, and Zn; $M^3$ is at least one element selected from the group consisting of Mg, Ca, Sr, Ba, and Zn; X is at least one halogen element; and $M^4$ is at least one element essentially including $Eu^{2+}$ selected from the group consisting of rare-earth elements and Mn.

In the starting materials, it is advantageous that $M^1$ in the formula (1) essentially includes at least Si, and a ratio of Si is 80 mol % or more; $M^2$ in the formula (2) essentially includes at least one of Ca and Sr, and a ratio of at least one of Ca and Sr is 60 mol % or more; $M^3$ in the formula (3) essentially includes at least Sr, and a ratio of Sr is 30 mol % or more; and X in the formula (3) essentially includes at least Cl, and a ratio of Cl is 50 mol % or more.

In the starting materials, it is advantageous that mole ratios of the compounds in the formulas (1) to (4) are weighed in the range of (1):(2)=1:0.25 to 1.0; (2):(3)=1:0.3 to 6.0; and (2):(4)=1:0.05 to 3.0. It is more advantageous that mole ratios of the compounds are in the range of (1):(2)=1:0.25 to 1.0; (2):(3)=1:0.3 to 4.0; and (2):(4)=1:0.05 to 3.0.

In the starting materials, the raw material in the composition formula (3) is weighed in an amount in excess of the stoichiometry ratio. This is because a part of halogen element is evaporated in the course of baking the raw mixture, and it is possible to prevent occurrence of crystal defect of the phosphor caused by shortage of a halogen element. In addition, the raw material added in excess of the stoichiometry ratio serves as flux for the solid-phase reaction, so that the solid-phase reaction can be accelerated and also a crystalline property can be improved.

In the first phosphor, the measurement result of the X-ray diffraction is not particularly limited. However, according to an X-ray diffraction pattern using a Kα characteristic X-ray of Cu, in at least a part of crystals included in the first phosphor, when a diffraction intensity of a highest-intensity diffraction peak is set to 100 in which a diffraction angle 2θ exists in the range from 29.0° to 30.5°, it is advantageous that a diffraction peak having a diffraction intensity of 50 or more exists in the range of $28.0°\leq 2\theta\leq 29.5°$; a diffraction peak having a diffraction intensity of 8 or more exists in the range of $19.0°\leq 2\theta\leq 22.0°$; a diffraction peak having a diffraction intensity of 15 or more exists in the range of $25.0°\leq 2\theta\leq 28.0°$; a diffraction peak having a diffraction intensity of 15 or more exists in the range of $34.5°\leq 2\theta\leq 37.5°$; a diffraction peak having a diffraction intensity of 10 or more exists in the range of $40.0°\leq 2\theta\leq 42.5°$; and a diffraction peak having a diffraction intensity of 10 or more exists in the range of $13.0°\leq 2\theta\leq 15.0°$.

In the first phosphor, the measurement result of the X-ray diffraction is not particularly limited. However, according to a diffraction pattern using a Kα characteristic X-ray of Mo in at least a part of crystals included in the first phosphor, when a diffraction intensity of a highest-intensity diffraction peak is set to 100 in which a diffraction angle 2θ exists in the range from 12.5° to 15.0°, it is advantageous that a diffraction peak having a diffraction intensity of 50 or more exists in the range of $12.0°\leq 2\theta\leq 14.5°$; a diffraction peak having a diffraction intensity of 8 or more exists in the range of $8.0°\leq 2\theta\leq 10.5°$; a diffraction peak having a diffraction intensity of 15 or more exists in the range of $11.0°\leq 2\theta\leq 13.0°$; a diffraction peak having a diffraction intensity of 15 or more exists in the range of $15.5°\leq 2\theta\leq 17.0°$; a diffraction peak having a diffraction intensity of 10 or more exists in the range of $17.5°\leq 2\theta\leq 19.5°$; and a diffraction peak having a diffraction intensity of 10 or more exists in the range of $5.0°\leq 2\theta\leq 8.0°$.

In the first phosphor, the crystal structure thereof is not particularly limited. However, it is advantageous that at least a part of crystals included in the first phosphor have a pyroxene crystal structure.

In addition, it is advantageous that at least a part of crystals included in the first phosphor belong to a crystal system being monoclinic, a Bravais lattice being a base-centered monoclinic lattice, and a space group being C2/m.

In the first phosphor, to obtain a higher light emitting intensity, it is advantageous that the amount of the crystals is as large as possible and is formed in a mono-phase, and it is advantageous that the content of the crystals is 20 weight % or more. It is more advantageous that the content of the crystals is 50 weight % or more to considerably improve the light emitting intensity.

The first phosphor may be formed of a mixture of the other crystal phase or amorphous phase. Particularly, with respect to the mixing ratio of the starting materials, in a phosphor in which quartz, trydimite, cristobalite, or the like formed of $SiO_2$ is composed as some by-products by excessively adding $SiO_2$, the light emitting intensity may be improved.

In the light emitting device according to the invention, a light emitting element that emits ultraviolet light or short-wavelength visible light is used as an excitation light source. For this reason, from the viewpoint of light emitting efficiency, light emitting brightness, and the like, it is advantageous that the first phosphor has a strong excitation band in a wavelength band of 350 to 430 nm.

In addition, from the viewpoint of a color rendering property, it is advantageous that a peak wavelength of a light emitting spectrum of the first phosphor is in a wavelength band of 560 to 590 nm, and a half-value width thereof is 100 nm or more.

It is not particularly limited that the second phosphor emits visible light which is in complementary-color relationship with the visible light emitted by the first phosphor. However, to obtain a light emitting device with white light, since the first phosphor mainly emits yellow light, it is advantageous to use a phosphor that emits blue light which is complementary-color relationship with the yellow light.

For the same purpose, from the viewpoint of a color rendering property, it is advantageous that a peak wavelength of a light emitting spectrum of the second phosphor is in a wavelength band of 440 to 470 nm, and a half-value width thereof is 30 to 60 nm.

As an example of the second phosphor, a phosphor may be used which is represented by the following formula: $Ca_{x-y-z}Mg_y(PO_4)_3Cl:Eu^{2+}_z$, wherein x is in the range of $4.95<x<5.50$; y is in the range of $0<y<1.50$; z is in the range of $0.02<z<0.20$; and y+z is in the range of $0.02\leq y+z\leq 1.7$.

It is not particularly limited that the light emitting element emits at least ultraviolet light or short-wavelength visible light. However, from the viewpoint of light emitting efficiency, and the like, it is advantageous that a peak of a light emitting spectrum thereof is in a wavelength band of 350 to 430 nm.

A semiconductor light emitting element may be used as the light emitting element. According to the semiconductor light emitting element, it is possible to obtain a light emitting device having a small size, power saving, and a long life. It is advantageous that an InGaN-based LED or LD having good light emitting property in a wavelength band near 400 nm is used as the light emitting element.

According to the light emitting device configured as described above, it is possible to provide a light emitting device that can emit white light having a high color rendering property or the other color light with high power.

Other aspects and advantages of the present invention will be apparent from the following description, the drawings, and the claims.

DETAILED DESCRIPTION OF EXEMPLARY EMBODIMENTS OF THE PRESENT INVENTION

Hereinafter, exemplary embodiments of the present invention will be described in detail, but the exemplary embodiments are not limited to the following examples.

Figure 1:
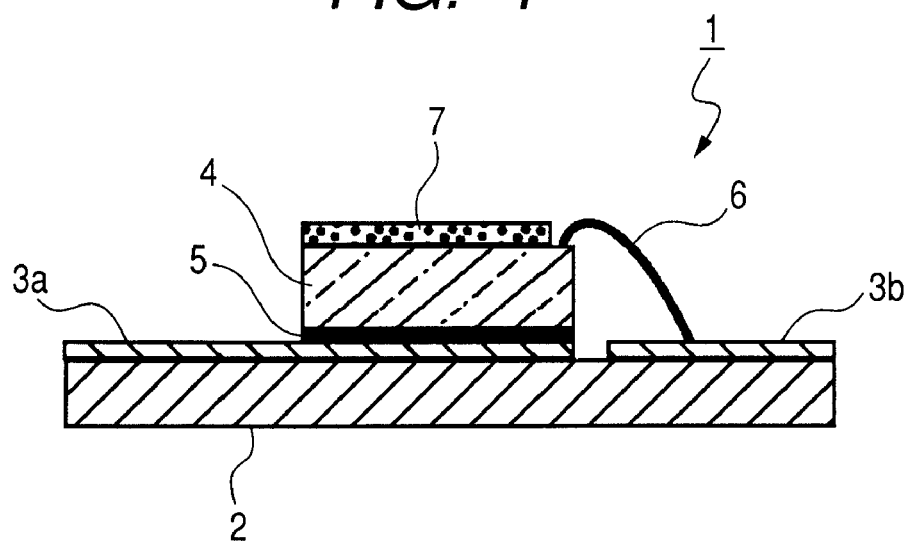
FIG. 1 is a schematic sectional view illustrating a light emitting device according to a first exemplary embodiment of the present invention.

FIG. 1 is a schematic sectional view illustrating a first exemplary embodiment of a light emitting device according to the invention.

In the light emitting device 1 shown in FIG. 1, an electrode 3a (anode) and an electrode 3b (cathode) are formed on a substrate 2. A semiconductor light emitting element 4 is fixed on the electrode 3a by a mount member 5. The semiconductor light emitting element 4 and the electrode 3a are electrically coupled to each other through the mount member 5, and the semiconductor light emitting element 4 and the electrode 3b are electrically coupled to each other through a wire 6. A phosphor layer 7 is formed on the semiconductor light emitting element 4.

The substrate 2 is advantageously made of materials having no conductivity, but having high thermal conductivity. For example, a ceramic substrate (e.g., an aluminum nitride substrate, an alumina substrate, a mullite substrate, or a glass ceramic substrate) or a glass epoxy substrate may be used.

The electrodes 3a and 3b are conductive layers made of metal materials such as, for example, gold or copper.

The semiconductor light emitting element 4 is an example of a light emitting element used in the light emitting device according to an exemplary embodiment of the present invention. For example, an LED or an LD may be used which emits ultraviolet light or short-wavelength visible light. As one example, an InGaN-based compound semiconductor may be used. In the InGaN-based compound semiconductor, a light emitting wavelength band thereof varies according to the content of In. When the content of In is large, the light emitting wavelength shifts to a long wavelength side. When the content of In is small, the light emitting wavelength shifts to a short wavelength side. The InGaN-based compound semiconductor containing an amount of In so that a peak wavelength is near 400 nm, has a high quantum efficiency in emitting light.

The mount member 5 is a conductive adhesive such as, for example, a silver paste or a gold tin eutectic solder. With the mount member 5, the lower surface of the semiconductor light emitting element 4 is fixed to the electrode 3a, and a lower electrode of the semiconductor light emitting element 4 is electrically coupled to the electrode 3a formed on the substrate 2.

The wire 6 is a conductive member such as, for example, a gold wire. For example, the wire 6 is bonded to an upper electrode of the semiconductor light emitting element 4 and the electrode 3b by ultrasonic thermal compression, thereby electrically coupling both electrodes to each other.

In the phosphor layer 7, a first phosphor is sealed in a film-like state in a binder member that covers the upper surface of the semiconductor light emitting element 4. Alternatively, the first phosphor may be combined with a second phosphor. The phosphor layer 7 is formed in the following manner: a phosphor paste is formed by mixing a phosphor into a liquid or gel binder member; the phosphor paste is applied onto the upper surface of the semiconductor light emitting element 4; and then the binder member of the applied phosphor paste is cured.

As the binder member, for example, a silicone resin or a fluorine resin may be used. Particularly, according to the light emitting device according to an exemplary embodiment of the present invention, since ultraviolet light or short-wavelength visible light is used as excitation light, it is advantageous to use a binder member having excellent ultraviolet light resistance.

One or more kinds of phosphors having light emitting properties different from that of the first phosphor and the second phosphor may be mixed into the phosphor layer 7. Accordingly, it is possible to obtain light having various colors by combining light of various wavelength bands.

Substances having various properties other than phosphors may be mixed into the phosphor layer 7. For example, substances such as metal oxides, fluorine compounds, and sulfides having a higher refractive index than that of a binder member may be mixed into the phosphor layer 7, thereby increasing the refractive index of the phosphor layer 7. With this configuration, total reflection is reduced when the light emitted from the semiconductor light emitting element 4 enters the phosphor layer 7, and thus it is possible to improve an entering efficiency of excitation light into the phosphor layer 7. When particle diameters of the mixed substances are made into nano size, it is possible to increase the refractive index without lowering transparency of the phosphor layer 7. In addition, a white powder having an average diameter of about 0.3 to 3 μm, such as alumina, zirconia, and titanium dioxide may be mixed into the phosphor layer 7, thereby preventing nonuniform brightness and chromaticity in a light emitting surface.

Figure 2:
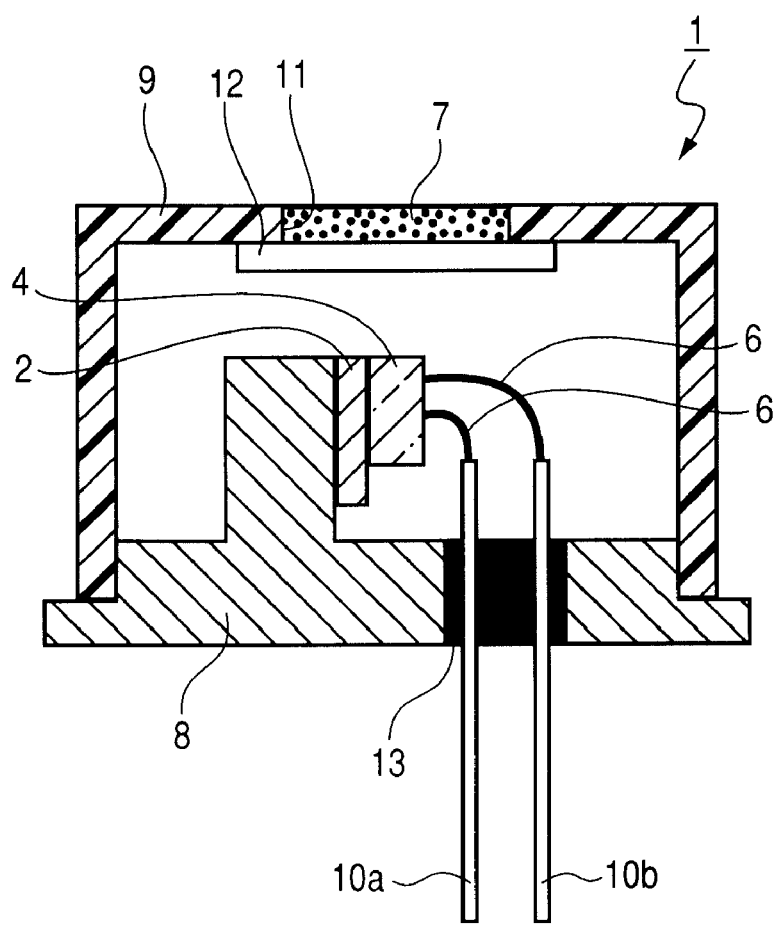
FIG. 2 is a schematic sectional view illustrating a light emitting device according to a second exemplary embodiment of the present invention.

FIG. 2 is a schematic sectional view illustrating a light emitting device according to a second exemplary embodiment of the present invention.

The second exemplary embodiment is a semiconductor light emitting device which is so called as a can package type. In the first exemplary embodiment, the phosphor layer 7 is formed on the surface of the semiconductor element 4. In the second exemplary embodiment, the phosphor layer 7 and the semiconductor light emitting element 4 are separated from each other. The same reference numerals are given to the same portions as the elements of the first exemplary embodiment shown in FIG. 1, the description of which will be omitted hereinafter.

In a light emitting device 1 shown in FIG. 2, inert gas is sealed in an airtight space configured by a metal stem 8 and a can cap 9. The semiconductor light emitting element 4 is provided in the airtight space and is fixed to the metal stem 8 through a substrate 2. A ceramic block 13 is fitted into an opening in the metal stem 8. An electrode terminal 10a (anode) and an electrode terminal 10b (cathode) extend out of the airtight space through the ceramic block 13, and the electrode terminals 10a and 10b and the semiconductor light emitting element 4 are electrically coupled with each other by wires 6. An opening 11 is formed on the upper face center of the can cap 9, and a transparent plate 12 is attached to the opening 11 inside the can cap 9. A phosphor layer 7 is formed in the opening 11.

Peripheral portions of the metal stem 8 and the can cap 9 are bonded by welding or the like, thereby forming the airtight space.

It is advantageous that the metal stem 8 and the can cap 9 are made of the same material. However, the metal stem 8 and the can cap 9 may be made of different materials. For example, various kinds of metal or alloy such as cobalt or copper-tungsten may be used. In the airtight space, the metal stem 8 supports the semiconductor light emitting element 4 and radiates heat generated by the semiconductor light emitting element 4 out of the airtight space. Thus, it is advantageous that the metal stem 8 is made of a material having high thermal conductivity.

The inert gas sealed into the airtight space is, for example, at least one inert gas of nitrogen, helium, or argon, thereby preventing the semiconductor light emitting element 4 from being heated.

The ceramic block 13 is a non-conductive member such as, for example, alumna or aluminum nitride, which is fitted and fixed to an opening formed in the metal stem 8, thereby electrically insulating the electrode terminals 10a and 10b from the metal stem 8.

The semiconductor light emitting element 4 is fixed to the substrate 2 by solder or the like, and the substrate 2 is fixed to the metal stem 8 by solder or the like.

The electrode terminals 10a and 10b are conductive members made of metals, for example, they may be formed by a punching process of a metal plate.

The transparent plate 12 is a sheet-shaped member made of a transparent material such as glass and resin, and may be flat, or have a convex shape or a concave shape to provide a lens effect.

The phosphor layer 7 is formed on the surface of the transparent plate 12 in the opening 11 by the same method as that described above.

Figure 3:
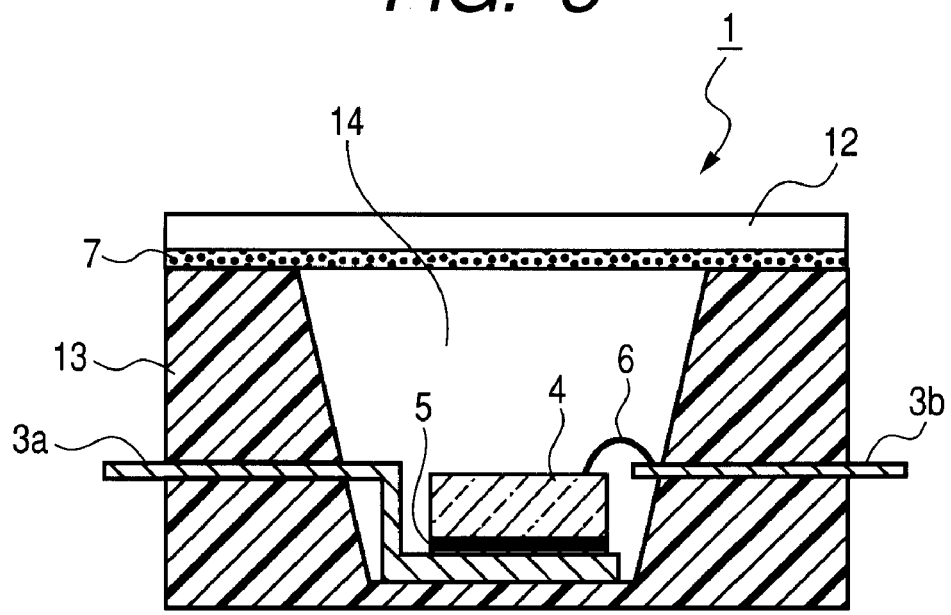
FIG. 3 is a schematic sectional view illustrating a light emitting device according to a third exemplary embodiment of the present invention.

FIG. 3 is a schematic sectional view illustrating a light emitting device according to a third exemplary embodiment of the present invention. The same reference numerals are given to the same portions as the elements of the first exemplary embodiment shown in FIG. 1, the description of which will be omitted hereinafter.

In a light emitting device 1 shown in FIG. 3, an electrode terminal 3a (anode) is formed, in part, on the bottom of a cup-shaped container body 13, and an electrode terminal 3b (cathode) is formed in the side surface.

The semiconductor light emitting element 4 is mounted on the upper surface of the electrode terminal 10a through a mount member 5 in the bottom of the container body 13. A lower electrode of the semiconductor light emitting element 4 and the electrode terminal 10a are electrically coupled to each other through the mount member 5, and an upper electrode of the semiconductor light emitting element 4 and the electrode terminal 10b are electrically coupled to each other through a wire 6.

The inner space of the container body 13 is filled with a filling member 14 to cover the semiconductor light emitting element 4, and the upper surface of the container body 13 is closed and sealed by a transparent plate 12. A phosphor layer 7 is formed on the surface of the transparent plate 12 close to the container body 13.

The container body 13 is made of resin such as, for example, polyphtalamide, aromatic nylon, polysulfone, polyamideimide, liquid crystal polymer, or polycarbonate, and may be molded integrally with electrode terminals 10a and 10b by insert molding or the like.

In the inner space of the container body 13, an opening inner surface is formed such that the diameter becomes larger from the bottom to the top, and a reflection treatment may be performed on the opening inner surface to reflect light emitted from the semiconductor light emitting element 4.

The filling member 14 is, for example, a transparent resin such as a silicone resin or a fluorine resin, and it is advantageous for the filling member 14 to exhibit good light resistance.

The phosphor layer 7 is formed on the surface of the transparent plate 12 that faces the inside of the container body 13 in the same manner as that of the first exemplary embodiment.

In the light emitting device configured as described above with respect to the first, second, and third exemplary embodiments, when driving current is applied to the electrode terminals 3a and 3b or the electrode terminals 10a and 10b, the current flows in the semiconductor light emitting element 4, and then the light emitting element 4 emits light having a characteristic wavelength band including ultraviolet light or short-wavelength visible light toward the phosphor layer 7. The phosphor in the phosphor layer 7 is excited by the light, and the phosphor emits light having a characteristic wavelength band. With these configurations, the semiconductor light emitting elements 4 and/or the phosphors are selected in various manners, thereby achieving a light emitting device that emits desired light.

Next, a first phosphor and a second phosphor used in the light emitting device according to exemplary embodiments of the present invention will be described in detail.

A first phosphor according to an exemplary embodiment of the present invention may be obtained as follows.

In the first phosphor, compounds represented by the following formulas (1) to (4) may be used as raw materials.

(1) $M^1O_2$, where $M^1$ represents a quadrivalent element such as Si, Ge, Ti, Zr, Sn, and the like.

(2) $M^2O$, where $M^2$ represents a divalent element such as Mg, Ca, Sr, Ba, Zn, and the like.

(3) $M^3X_2$, where $M^3$ represents a divalent element such as Mg, Ca, Sr, Ba, Zn, and the like, and X represents a halogen element.

(4) $M^4$, where $M^4$ represents a rear-earth element such as $Eu^{2+}$ and/or Mn.

For example, $SiO_2$, $GeO_2$, $TiO_2$, $ZrO_2$, $SnO_2$ may be used as the raw material in the composition formula (1).

For example, a carbonate, an oxide, a hydroxide, or the like of divalent metal ions may be used as the raw material in the composition formula (2).

For example, $SrCl_2$, $SrCl_2.6H_2O$, $MgCl_2$, $MgCl_2.6H_2O$, $CaCl_2$, $CaCl_2.2H_2O$, $BaCl_2$, $BaCl_2.2H_2O$, $ZnCl_2$, $MgF_2$, $CaF_2$, $SrF_2$, $BaF_2$, $ZnF_2$, $MgBr_2$, $CaBr_2$, $SrBr_2$, $BaBr_2$, $ZnBr_2$, $MgI_2$, $CaI_2$, $SrI_2$, $BaI_2$, $ZnI_2$, or the like may be used as the raw material in the composition formula (3).

For example, $Eu_2O_3$, $Eu_2(CO_3)_3$, $Eu(OH)_3$, $EuCl_3$, MnO, $Mn(OH)_2$, $MnCO_3$, $MnCl_2.4H_2O$, $Mn(NO_3)_2.6H_2O$, or the like may be used as the raw material in the composition formula (4).

As the raw material in the composition formula (1), it is advantageous to use a compound that includes at least one element selected from the group consisting of Si, Ge, Ti, Zr, and Sn, in which $M^1$ essentially includes at least Si and a ratio of Si is 80 mol % or more.

As the raw material in the composition formula (2), it is advantageous to use a compound that includes at least one element selected from the group consisting of Mg, Ca, Sr, Ba, and Zn, in which $M^2$ essentially includes at least Ca and/or Sr and a ratio of Ca and/or Sr is 60 mol % or more.

As the raw material in the composition formula (3), it is advantageous to use a compound that includes at least one element selected from the group consisting of Mg, Ca, Sr, Mg, Ba, and Zn, in which $M^3$ essentially includes Sr and a ratio of Sr is 30 mol % or more, and where X is a halogen element essentially including at least Cl and a ratio of Cl is 50 mol % or more.

As the raw material in the composition formula (4), it is advantageous that $M^4$ is a rare-earth element essentially including divalent Eu and may include Mn and/or another rare-earth element in addition to Eu.

Mole ratios in the composition formulas (1) to (4) are weighed at the following ratio. (1):(2)=1:0.1 to 1.0, (2):(3)=1:0.2 to 12.0, (2):(4)=1:0.05 to 4.0, preferably, (1):(2)=1:0.25 to 1.0, (2):(3)=1:0.3 to 6.0, (2):(4)=1:0.05 to 3.0, more preferably, (1):(2)=1:0.25 to 1.0, (2):(3)=1:0.3 to 4.0, (2):(4)=1:0.05 to 3.0. Then, the weighed raw materials are put into an alumina mortar, and the raw materials are pulverized and mixed for about 30 minutes, thereby obtaining a raw mixture. The raw mixture is put into an alumna crucible, and the raw mixture is baked in an electrical furnace of a reduction atmosphere, in an atmosphere (5/95) of $(H_2/N_2)$, at a temperature of 700° C. to 1100° C. or less, for 3 to 40 hours, thereby obtaining a baked material. The baked material is minutely washed with warm pure water, and excess chloride is washed off, thereby obtaining a phosphor of the invention.

It is advantageous that the raw material (divalent metal halide) in the composition formula (3) is weighed in an amount in excess of the stoichiometry ratio. This is because a part of the halogen element is evaporated in the course of baking the raw mixture, and it is possible to prevent occurrence of a crystal defect of the phosphor caused by a shortage of a halogen element. In addition, the raw material added in excess of the stoichiometry ratio in the composition formula (3) becomes liquid at the baking temperature and serves as flux for the solid-phase reaction, so that the solid-phase reaction can be accelerated and also a crystalline property can be improved.

After baking the raw mixture, the raw material added in excess of the stoichiometry ratio in the composition formula (3) exists as impurities in the produced phosphor. Thus, in order to obtain a phosphor with high purity and high light emitting intensity, these impurities are washed off with warm pure water.

The composition ratio represented in the formula of the phosphor of the invention is a composition ratio after washing impurities off, and the raw material added in excess of the stoichiometry ratio as impurities in the composition formula (3) as described above is not applied to this composition ratio.

According to the phosphor according to an exemplary embodiment of the present invention, in order to obtain a phosphor having high luminous efficiency, it is advantageous to reduce a metallic element serving as impurity as much as possible. Especially, a transition metal element such as Fe, Co, and Ni serves as an inhibitor that inhibits light emitting of the phosphor. Therefore, it is advantageous to use a raw material with high purity and to prevent impurities from being mixed in mixture process, such that total amount of the transition metal element is 500 ppm or less.

<Crystal Structure of the First Phosphor>

While growing mono-crystals of host crystals, the crystal structure or the like of the first phosphor of the invention was defined on the basis of the analysis result thereof. The host crystal is a substance that is represented by $M^1$=Si, $M^2$=Ca and Sr, $M^3$=Sr, and X=Cl in the formula $M^1O_2.aM^2O.bM^3X_2:M^4$ and does not include $M^4$.

<Production and Analysis of Host Crystal>

Mono-crystals of host crystals were grown and produced in the following order. Raw materials of $SiO_2$, CaO, and $SrCl_2$ were weighed so that a mole ratio thereof was $SiO_2$:CaO:$SrCl_2$=1:0.71:1 07. The weighed raw materials were put into an alumina mortar, and the raw materials were pulverized and mixed for about 30 minutes, thereby obtaining a raw mixture. This raw mixture was put into a tablet mold and was compression-molded at 100 MPa, thereby obtaining a mold. This mold was put into an alumina crucible and a lid was closed, and then the mold was baked in the air at 1030° C. for 36 hours, thereby obtaining a baked material. The baked material was washed with warm pure water and ultrasonic waves, thereby obtaining host crystals. Mono-crystals of Φ0.2 mm were obtained from the host crystals grown and produced as described above.

The obtained host crystals were subjected to element quantitative analysis in the following manner to define a composition ratio (i.e., the values of a and b in the formula).

1. Quantitative Analysis of Si

The host crystals were melted with sodium carbonate in a platinum crucible and then were dissolved with dilute nitric acid to be constant. The Si amount of this solution was measured using an ICP light emitting spectrum analyzer (manufactured by SII NanoTechnology Inc.: SPS-4000).

2. Quantitative Analysis of Metal Element

The host crystals were heated and decomposed under inert gas with perchloric acid, nitric acid, and hydrofluoric acid and then the decomposed result was dissolved with dilute nitric acid to be constant. The metal element amount of this solution was measured using an ICP light emitting spectrum analyzer (manufactured by SII NanoTechnology Inc.: SPS-4000).

3. Quantitative Analysis of Cl

The host crystals were burned in a tube-shaped electrical furnace, and the generated gas was absorbed into absorption liquid. The Cl amount of this solution was determined by ion chromatography using DX-500 manufactured by Dionex Inc.

4 Quantitative Analysis of O

The host crystals were pyrolyzed in argon using nitrogen oxygen analyzer TC-436 manufactured by LECO Inc., and the generated oxygen was weighed by an infrared ray absorption method.

As a result of the element quantitative analysis, the general composition ratio of the obtained host crystals is as follows.

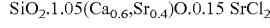

$SiO_2 \cdot 1.05(Ca_{0.6}, Sr_{0.4})O \cdot 0.15\ SrCl_2$

A specific gravity of the host crystals measured by a pycnometer was 3.4.

Figure 4:
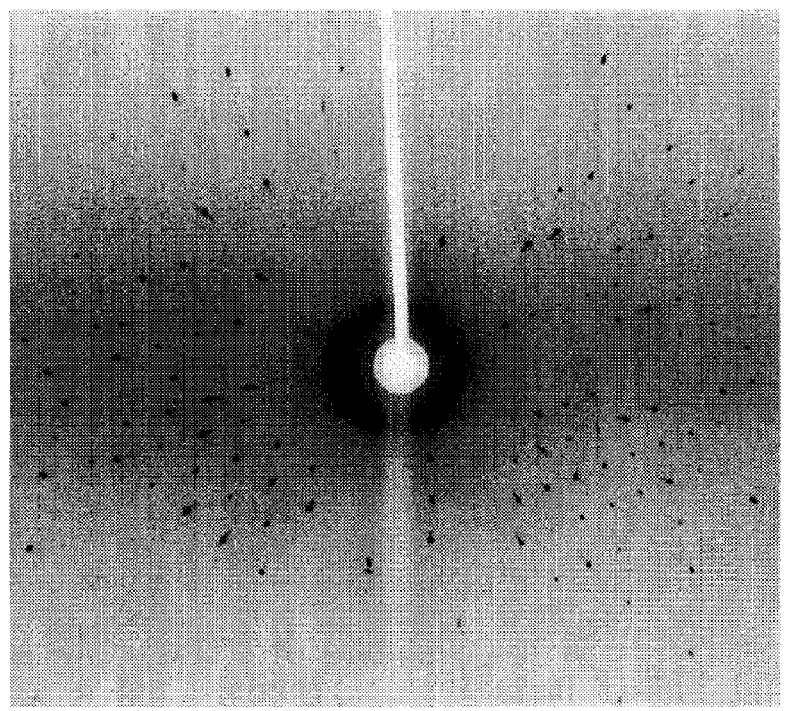
FIG. 4 is a diagram illustrating an example of an X-ray diffraction photograph of mono-host crystal.

An X-ray diffraction pattern using a Kα-ray (wavelength λ=0.71 Å) of Mo in the mono-crystals of the host crystals was measured by an imaging plate mono-crystal automatic X-ray structure analyzer (manufactured by RIGAKU: R-AXIS RAPID) (Hereinafter, referred to as Measurement 1). An example of X-ray diffraction picture obtained by Measurement 1 is shown in FIG. 4.

The following crystal structure was analyzed using 5709 diffraction spots obtained in the range of 2θ<60° (d>0.71 Å) by Measurement 1.

A crystal system, a Bravais lattice, a space group, and a lattice constant of the host crystals were determined as follows using a data processing software (produced by RIGAKU: Rapid Auto), from the X-ray diffraction pattern of Measurement 1.

Crystal system: monoclinic
Bravais lattice: base-centered monoclinic lattice
Space group: C2/m
Lattice constant:
a=13.3036(12) Å
b=8.3067(8) Å
c=9.1567(12) Å
α=γ=90°
β=110.226(5)°
υ=949.50(18) Å³

Using crystal structure analysis software (produced by RIGAKU Crystal structure), a general structure was determined by a direct method, and then structural parameters (occupancy, atomic coordinates, temperature factor, etc) were refined by a minimum square method.

The refinement was performed with respect to |F| independent 1160 points of |F|>2σ_F. As a result, a crystal structure model with reliability factor $R_1$=27% was obtained. The crystal structure model is hereinafter referred to as "initial structure model".

The atomic coordinates and occupancy of the initial structure model obtained from the mono-crystals are shown in Table 1.

TABLE 1

Atomic coordinates of initial structure model obtained from mono-crystals

| Elements | Site | X | y | z | Occupancy |
|---|---|---|---|---|---|
| Ca1 | 2c | 0.0000 | 0.0000 | 0.5000 | 1 |
| Sr2 | 4i | 0.28471 (5) | 0.5000 | 0.07924 (6) | 1 |
| Sr3 | 8j | 0.09438 (5) | 0.74970 (8) | 0.24771 (6) | 0.427 (5) |
| Ca3 | 8j | 0.09438 (5) | 0.74970 (8) | 0.24771 (6) | 0.573 (5) |
| Cl1 | 2b | 0.0000 | 0.5000 | 0.0000 | 1 |
| Cl2 | 2a | 0.0000 | 0.0000 | 0.0000 | 1 |
| Si1 | 4i | 0.2323 (1) | 0.5000 | 0.4989 (2) | 1 |
| Si2 | 8j | −0.15109 (9) | 0.6746 (1) | 0.2854 (1) | 1 |
| O1 | 4i | −0.0985 (3) | 0.5000 | 0.2645 (5) | 1 |
| O2 | 4i | 0.1987 (3) | 0.5000 | 0.3145 (4) | 1 |
| O3 | 4i | 0.3575 (3) | 0.5000 | 0.6019 (5) | 1 |
| O4 | 8j | 0.1734 (2) | 0.3423 (3) | 0.5469 (3) | 1 |
| O5 | 8j | −0.2635 (2) | 0.7007 (3) | 0.1478 (3) | 1 |
| O6 | 8j | −0.0677 (2) | 0.8154 (4) | 0.2941 (2) | 1 |

The composition ratio of the initial structure model obtained from the mono-crystals was calculated as follow.

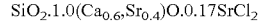

$SiO_2 \cdot 1.0(Ca_{0.6}, Sr_{0.4})O \cdot 0.17 SrCl_2$

As an analysis result, the crystals of the invention were identified as crystals with a structure which has not been registered in the International Center for Diffraction Data (ICDD), which is an X-ray diffraction database widely used for X-ray diffraction.

Subsequently, powder host crystals having the same form as the phosphor were adjusted, and it was examined whether the host crystals has the crystal structure belonging to the initial structure model.

The powder host crystals were adjusted in the following order. First, raw materials of $SiO_2$, CaO, SrO, and $SrCl_2$ were weighed so that a mole ratio thereof was $SiO_2$:CaO:SrO:$SrCl_2$=1.0:0.7:0.2:1.0. The weighed raw materials were put into an alumina mortar, and the raw materials were pulverized and mixed for about 30 minutes, thereby obtaining a raw mixture. The raw mixture was put into a tablet mold and was compression-molded at 100 MPa, thereby obtaining a mold. This mold was put into an alumina crucible and a lid was closed, and then the mold was baked at 1030° C. for 5 to 40 hours, thereby obtaining a baked material. The baked material was washed with warm pure water and ultrasonic waves, thereby obtaining powder crystals.

To obtain a detail crystal structure of the powder host crystal, a powder X-ray diffraction was measured using a Kα characteristic X-ray of Mo by a high resolution-limit powder X-ray diffraction device (manufactured by RIGAKU specially ordered product) (hereinafter, referred to as Measurement 2).

On the basis of the result of Measurement 2, Rietveld analysis was performed to determine a crystal structure. In the Rietveld analysis, the lattice constant model was refined by the least squares method using the atomic coordinates, and the space group of the initial structure model.

As a result, the diffraction pattern observed in Measurement 2 and the calculated diffraction pattern fitted by the Rietveld analysis were substantially matched with each other, and an R factor representing a matching index indicated a very small value as Rwp=2.84%. Accordingly, it was identified that the host crystals of the mono-crystals and the powder host crystals were crystals having the same structure.

Figure 5:
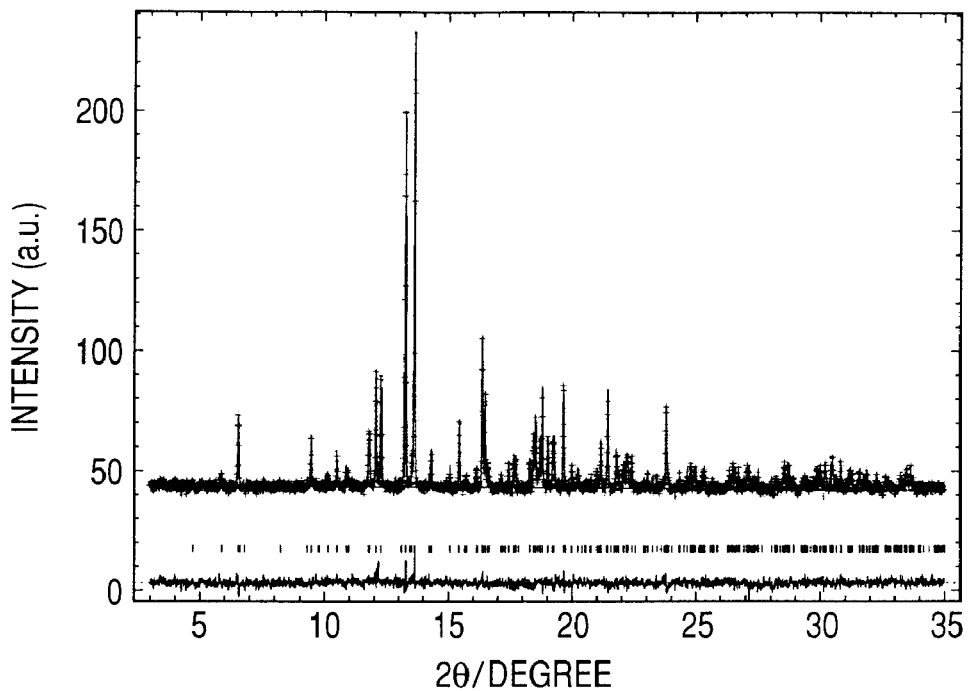
FIG. 5 is a fitting diagram of X-ray diffraction (Measurement 2) of power host crystal.

In FIG. 5, a Rietveld analysis fitting diagram with respect to Measurement 2 is shown. In the upper portion in FIG. 5, a solid line denotes the powder X-ray diffraction pattern calculated by the Rietveld analysis, a cross block denotes the powder X-ray diffraction pattern observed by Measurement 2. The middle portion in FIG. 5 denotes a peak angle of diffraction calculated by the Rietveld analysis. The lower portion in FIG. 5 denotes that difference between the calculated value and the observed value of the powder X-ray diffraction pattern are plotted, in which both have substantially no difference and are substantially matched with each other.

The lattice constants of the refined powder host crystals are shown as follows.

a=13.2468(4) Å, b=8.3169(2) Å, c=9.1537(3) Å
α=γ=90°, β=110.251(2)°
υ=946.1(1) Å$^3$

The calculated element coordinates of the powder host crystals are shown in Table 2.

TABLE 2

| Elements | Site | x | y | z | Occupancy |
|---|---|---|---|---|---|
| Ca1 | 2c | 0.0000 | 0.0000 | 0.5000 | 1 |
| Sr2 | 4i | 0.28441 (6) | 0.5000 | 0.07876 (9) | 1 |
| Sr3 | 8j | 0.0947 (1) | 0.7501 (2) | 0.2476 (2) | 0.340 |
| Ca3 | 8j | 0.0947 (1) | 0.7501 (2) | 0.2476 (2) | 0.660 |
| Cl1 | 2b | 0.0000 | 0.5000 | 0.0000 | 1 |
| Cl2 | 2a | 0.0000 | 0.0000 | 0.0000 | 1 |
| Si1 | 4i | 0.2314 (1) | 0.5000 | 0.4975 (2) | 1 |
| Si2 | 8j | 0.15127 (9) | 0.3253 (1) | 0.7146 (1) | 1 |
| O1 | 4i | 0.1003 (3) | 0.5000 | 0.7376 (4) | 1 |
| O2 | 4i | 0.1977 (2) | 0.5000 | 0.3187 (4) | 1 |
| O3 | 4i | 0.3549 (3) | 0.5000 | 0.5999 (4) | 1 |
| O4 | 8j | 0.1719 (2) | 0.3418 (2) | 0.5463 (3) | 1 |
| O5 | 8j | 0.2629 (2) | 0.3003 (3) | 0.8527 (3) | 1 |
| O6 | 8j | 0.0680 (2) | 0.1850 (3) | 0.7055 (2) | 1 |

A theoretical composition ratio of the powder host crystals, which is calculated by the Rietveld analysis on the basis of Measurement 2, is shown below.

<Theoretical Composition Ratio of Powder Host Crystals>

$SiO_2 \cdot 1.0(Ca_{0.6},Sr_{0.4})O \cdot 0.17SrCl_2$

In the host crystals, elements capable of farming solid solution are enumerated below. Herein, a solid solution denotes a solution having a lattice constant different from the host crystals but having the same crystal structure, in which a composition ratio of elements constituting the host crystals is varied or a part of elements constituting the host crystals is substituted by an extra element.

<Element Group Solid-Soluble into Host Crystals>
Substituent of Si in $SiO_2$: Ge, Ti, Zr, and Sn
Substituent of Ca or Sr in $(Ca_{0.6}, Sr_{0.4})O$: Mg, Ba, Zn, Mn and rear-earth elements
Substituent of Sr in $SrCl_2$: Mg, Ca, Ba, and Zn
Substituent of Sr in $SrCl_2$: F, Br, and I
A part of $SiO_2$ formed of an oxide of an element in Group 4 may be substituted by $1/2(B, P)O_4$, $1/2(Al, P)O_4$.

<Identification of Crystal Structure of First Phosphor>

The identification of the crystal structure of the solid solution may be judged from a diffraction result of X-ray diffraction or neutron-ray diffraction. However, crystals in which solid-soluble elements other than the raw crystals are substituted for a part of the constituent elements have a varied lattice constant. Accordingly, even for crystals belonging to the same crystal structure as the raw crystals, the diffraction result may not be completely the same.

In the crystals belonging to the same crystal structure, when the lattice constant becomes smaller due to element substitution, a diffraction angle is shifted to a high angle. When the lattice constant becomes larger, the diffraction angle is shifted to a low angle.

In this case, evaluation using the following judgment methods was performed to judge whether the powder host crystals and the first phosphor (Phosphor 1) belongs the same crystal structure. In the first phosphor, a part of Ca and/or Sr ($M^2$ element in the formula) constituting the host crystals is substituted by $Eu^{2+}$ serving as an emission center of the phosphor ($M^4$ element in the formula).

As a judgment method for determining a crystal structure, it can be judged whether crystals have the same structure by performing Rietveld analysis on the result of X-ray diffraction (or neutron-ray diffraction) and obtaining an R factor, using the lattice constant, the element coordinates, and the space group of the initial crystal model as a model.

Particularly, when the Rietveld analysis judgment is converged to a low R factor having the same level as the Rietveld analysis of the powder host crystals, it can be judged of that the crystals have the same structure.

A fine difference in structure may be discriminated by comparing the lattice constant or the element coordinates obtained by the Rietveld analysis.

Figure 6:
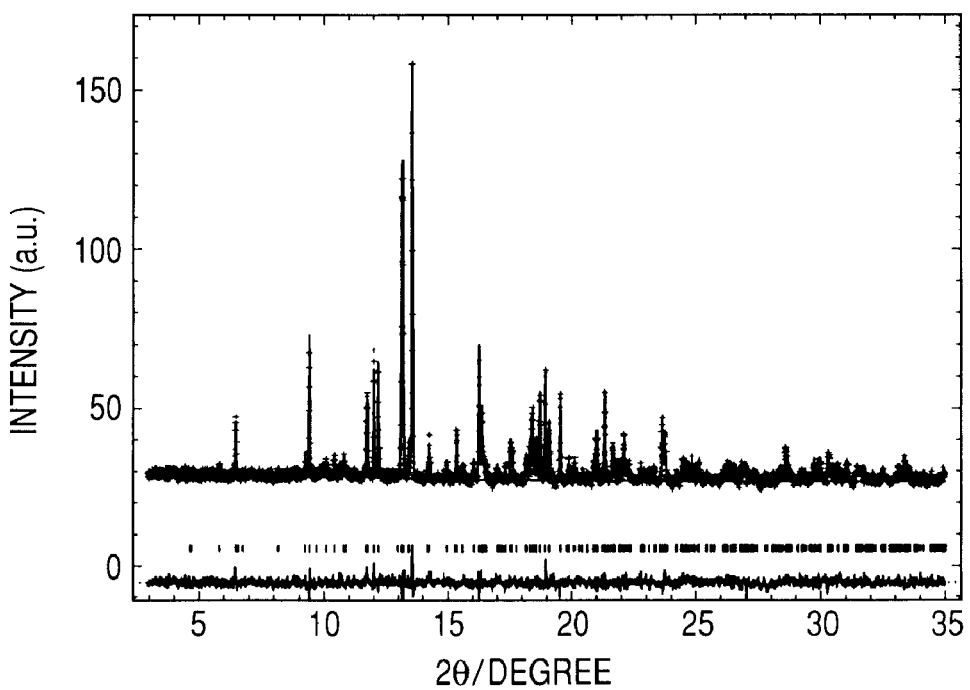
FIG. 6 is a fitting diagram of X-ray diffraction (Measurement 3) of Phosphor 1 of the present invention.

To use such a judgment method, an X-ray diffraction pattern of the phosphor (Phosphor 1) of the invention was measured under the same condition as Measurement 2 (hereinafter, referred to as Measurement 3). Rietveld analysis using the initial structure model as a model was performed on the basis of the obtained X-ray diffraction pattern. As a result, a value of the R factor $R_{wr}$ was very small, i.e., 3 69%, and the value was converged in the same level as the value of $R_{wr}$ of the powder host crystals. In FIG. 6, a Rietveld analysis fitting degree about Measurement 3 is shown. In the upper portion in FIG. 6, a solid line denotes the powder X-ray diffraction pattern calculated by the Rietveld analysis, and a cross block denotes the powder X-ray diffraction pattern observed from Measurement 3. The middle portion in FIG. 6 denotes a peak angle of diffraction calculated by the Rietveld analysis. The lower portion in FIG. 6 denotes that difference between the calculated value and the observed value of the powder X-ray diffraction pattern are plotted, in which both have substantially no difference and are substantially matched with each other. As described above, it is judged that the first phosphor has the same crystal structure as the host crystals.

The second phosphor can be obtained, for example, as follows.

In the second phosphor, using $CaCO_3$, $MgCO_3$, $CaCl_2$, $CaHPO_4$, and $Eu_2O_3$ as raw materials, mole ratios of raw materials are weighted at the following ratio: $CaCO_3$:$MgCO_3$:$CaCl_2$:$CaHPO_4$:$Eu_2O_3$=0.05 to 0.35:0.01 to 0.50:0.17 to 0.50:1.00:0.005 to 0.050. Then, the weighed raw materials are put into an alumina mortar, and the raw materials are pulverized and mixed for about 30 minutes, thereby obtaining a raw mixture. The raw mixture is put into an alumna crucible, and the raw mixture is baked in an atmosphere $N_2$ including 2 to 5% $H_2$, at a temperature of 800° C. to 1200° C. or less, for 3 hours, thereby obtaining a baked material. The baked material is minutely washed with warm pure water, and excess chloride is washed off, thereby obtaining the second phosphor.

In the weighting (mole ratio) of $CaCl_2$ at the time of obtaining the second raw material mixture, it is advantageous that the raw material is weighed in an amount in excess of the stoichiometry ratio by 0.5 mol or more, with respect to the composition ratio of the obtained second phosphor. Accordingly, it is possible to prevent a crystal defect of the second phosphor caused by a shortage of $Cl_2$.

Hereinafter, the present invention will be described in detail by reference to examples. However, the following description of the chemical composition, raw materials, production methods, etc. does not restrict the exemplary embodiments of the light emitting device of the invention.

First, a phosphor used in the light emitting device of the present exemplary embodiment will be described.

<Phosphor 1>

A phosphor represented by $SiO_2.0.9(Ca_{0.5}, Sr_{0.5})O.0.17SrCl_2:Eu^{2+}_{0.1}$ was used. Phosphor 1 is an example of the first phosphor, and satisfies the following relationships: $M^1=Si$, $M^2=Ca/Sr$ (mole ratio: 50/50), $M^3=Sr$, $X=Cl$, $M^4=Eu^{2+}$, $a=0.9$, $b=0.17$, and content c (mole ratio) of $M^4$ satisfies $c/(a+c)=0.1$, in the formula $M^1O_2.aM^2O.bM^3X_2:M^4$.

Phosphor 1 was produced as follows.

Raw materials of $SiO_2$, $Ca(OH)_2$, $SrCl_2.6H_2O$, and $Eu_2O_3$, were weighed so that a mole ratio thereof satisfies $SiO_2:Ca(OH)_2:SrCl_2.6H_2O:Eu_2O_3=1.0:0.65:1.0:0.13$, the weighed materials were put into an alumina mortar, and the materials were pulverized and mixed for about 30 minutes, thereby obtaining a raw mixture. The raw mixture was put into an alumina crucible and was baked in an electrical furnace of a reduction atmosphere, in an atmosphere of (5/95) of ($H_2/N_2$), at 1030° C., for 5 to 40 hours, thereby obtaining a baked material. The baked material was washed with warm pure water, thereby obtaining Phosphor 1, an example of the first phosphor.

<Phosphor 2>

A phosphor represented by $SiO_2.0.9(Ca_{0.6}, Sr_{0.4})O.0.17SrCl_2:Eu^{2+}_{0.1}$ was used.

Phosphor 2 is an example of the first phosphor, and satisfies the following relationships: $M^1=Si$, $M^2=Ca/Sr$ (mole ratio: 60/40), $M^3=Sr$, $X=Cl$, $M^4=Eu^{2+}$, $a=0.9$, $b=0.17$, and content c (mole ratio) of $M^4$ satisfies $c/(a+c)=0.1$, in the formula $M^1O_2.aM^2O.bM^3X_2:M^4$. In Phosphor 2, cristobalite is generated in the phosphor by excessively adding $SiO_2$ in the mixing ratio of raw materials.

Phosphor 2 was produced as follows.

Raw materials of $SiO_2$, $Ca(OH)_2$, $SrCl_2.6H_2O$, and $Eu_2O_3$ were weighed so that a mole ratio thereof satisfies $SiO_2:Ca(OH)_2:SrCl_2.6H_2O:Eu_2O_3=1.1:0.45:1.0:0.13$, and then the same method as in Example 1 was followed, thereby obtaining Phosphor 2, another example of the first phosphor.

<Phosphor 3>

A phosphor represented by $SiO_2.0.86(Ca_{0.47}, Sr_{0.52}, Ba_{0.01})O.0.17SrCl_2:Eu^{2+}_{0.14}$ was used. Phosphor 3 is an example of the first phosphor, and satisfies the following relationships: $M^1=Si$, $M^2=Ca/Sr/Ba$ (mole ratio: 47/52/1), $M^3=Sr$, $X=Cl$, $M^4=Eu^{2+}$, $a=0.86$, $b=0.17$, and content c (mole ratio) of $M^4$ satisfies $c/(a+c)=0.14$, in the formula $M^1O_2.aM^2O.bM^3X_2:M^4$. In Phosphor 3, the element $M^2$ further contains Ba in addition to Ca and Sr, and cristobalite is generated in the phosphor by excessively adding $SiO_2$ in the mixing ratio of raw materials.

Phosphor 3 was produced as follows.

Raw materials of $SiO_2$, $CaCO_3$, $BaCO_3$, $SrCl_2.6H_2O$, and $Eu_2O_3$ were weighed so that a mole ratio thereof satisfies $SiO_2:CaCO_3:BaCO_3:SrCl_2.6H_2O:Eu_2O_3=1.68:0.45:0.02:1.0:0.13$, and then the same method as in Example 1 was followed, thereby obtaining Phosphor 3, another example of the first phosphor.

<Phosphor 4>

A phosphor represented by $SiO_2.0.86(Ca_{0.49}, Sr_{0.50}, Ba_{0.01})O.0.17SrC_2:Eu^{2+}_{0.14}$ was used. Phosphor 4 is an example of the first phosphor, and satisfies the following relationships: $M^1=Si$, $M^2=Ca/Sr/Mg$ (mole ratio: 49/50/1), $M^3=Sr$, $X=Cl$, $M^4=Eu^{2+}$, $a=0.86$, $b=0.17$, and content c (mole ratio) of $M^4$ satisfies $c/(a+c)=0.14$, in the formula $M^1O_2.aM^2O.bM^3X_2:M^4$.

In Phosphor 4, the element $M^2$ further contains Mg in addition to Ca and Sr, and cristobalite is generated in the phosphor by excessively adding $SiO_2$ in the mixing ratio of raw materials.

Phosphor 4 was produced as follows.

Raw materials of $SiO_2$, $CaCO_3$, $MgCO_3$, $SrCl_2.6H_2O$, and $Eu_2O_3$ were weighed so that a mole ratio thereof satisfies $SiO_2:CaCO_3:MgCO_3:SrCl_2.6H_2O:Eu_2O_3=1.68:0.45:0.02:1.0:0.13$, and then the same method as in Example 1 was followed, thereby obtaining Phosphor 4, another example of the first phosphor.

<Phosphor 5>

A phosphor represented by $(Ca_{4.67}, Mg_{0.5})(PO_4)_3Cl:Eu_{0.8}$ was used. Phosphor 5 is an example of the second phosphor.

Phosphor 5 was produced as follows.

Raw materials of $CaCO_3$, $MgCO_3$, $CaCl_2$, $CaHPO_4$, and $Eu_2O_3$ were weighed so that a mole ratio thereof satisfies $CaCO_3:MgCO_3:CaCl_2:CaHPO_4:Eu_2O_3=0.42:0.5:3.0:1.25:0.04$, the weighed raw materials were put into an alumina mortar, and pulverized and mixed for about 30 minutes, thereby obtaining a raw mixture. The raw mixture was put into an alumina crucible and was baked in an atmosphere of $N_2$ including 2 to 5% $H_2$, at 800° C. or more and less than 1200° C., for 3 hours, thereby obtaining a baked material. The baked material was washed with warm pure water, thereby obtaining Phosphor 5, an example of the second phosphor.

<Comparative Phosphor 1>

A phosphor (produced by Kasei Optonix, Ltd.) represented by $BaMgAl_{10}O_{17}:Eu, Mn$ was used as a Comparative Phosphor 1. This phosphor has good light resistance in phosphors of green light emission of near-ultraviolet excitation, and is listed in the Japanese government project "Logic Model of Development of Highly Efficient LED (Plan for Light of 21 st-Century)".

<Comparative Phosphor 2>

A phosphor (produced by Kasei Optonix, Ltd.) represented by $Sr_5(PO_4)_3Cl:Eu$ was used as a Comparative Phosphor 2. This phosphor is a blue phosphor for a 3-wavelength luminescent lamp.

Figure 7:
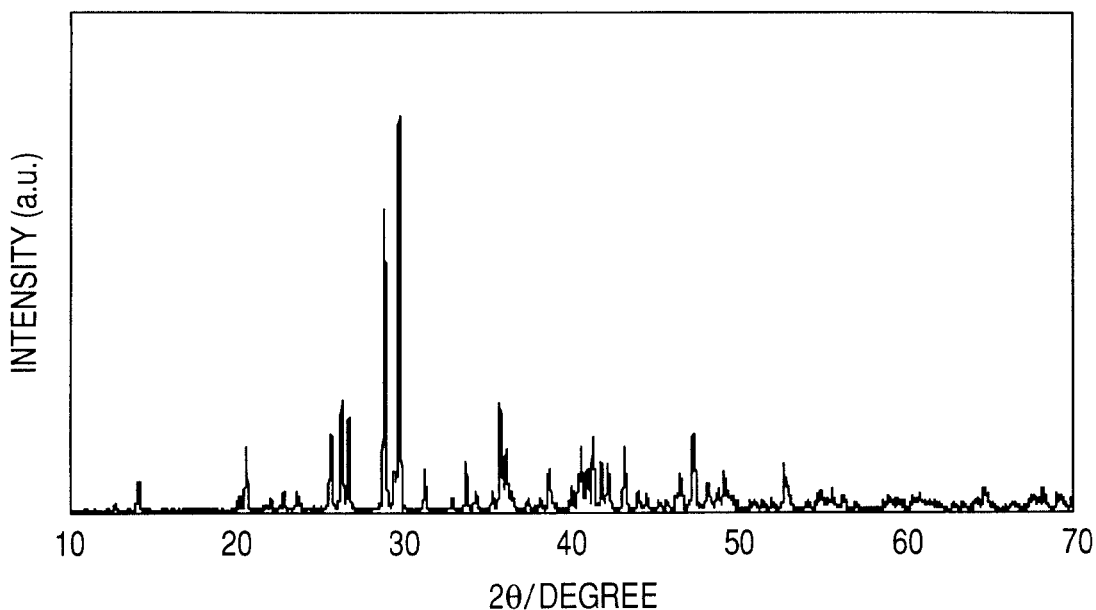
FIG. 7 is a diagram illustrating a measurement result of X-ray diffraction using a Kα characteristic X-ray of Cu in Phosphor 1 according to the present invention.
Figure 8:
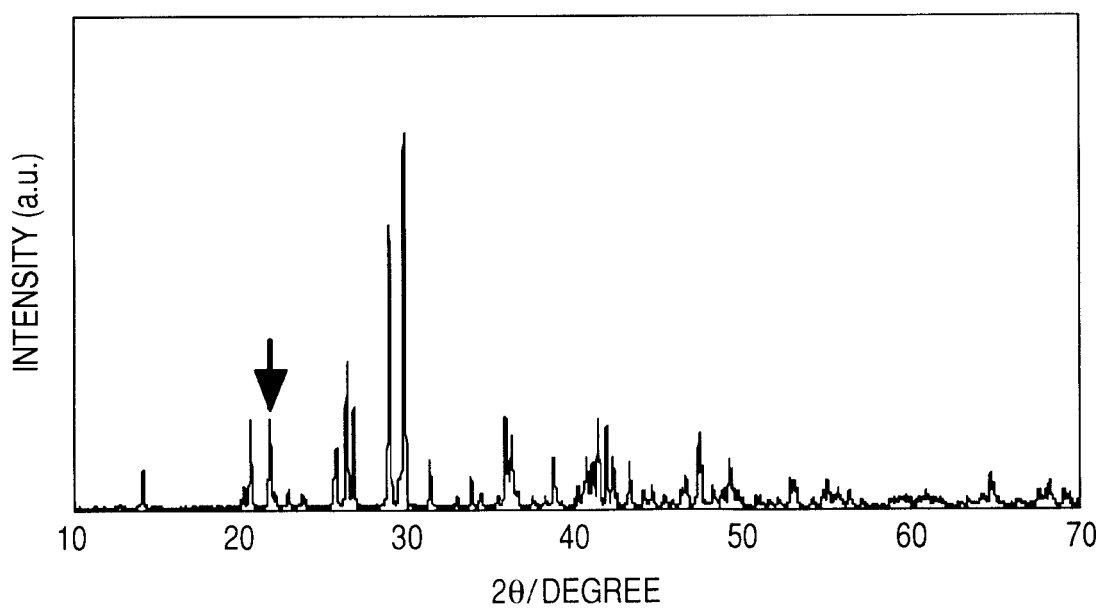
FIG. 8 is a diagram illustrating a measurement result of X-ray diffraction using a Kα characteristic X-ray of Cu in Phosphor 2 according to the present invention.

The crystal structure of Phosphors 1 to 5 were confirmed by using an X-ray diffraction device (manufactured by RIGAKU: RINT-Ultima3). Particularly, in Phosphors 1 to 4 that are examples of the first phosphor, two kinds of diffraction patterns representatively shown in FIGS. 7 and 8 were confirmed. FIG. 7 shows an X-ray diffraction pattern using a Kα characteristic X-ray of Cu in Phosphor 1. FIG. 8 shows an X-ray diffraction pattern using a Kα characteristic X-ray of Cu in Phosphor 2.

As shown in FIGS. 7 and 8, in both of the X-ray diffraction patterns using a Kα characteristic X-ray of Cu, when the highest diffraction intensity of a diffraction peak is set to 100 in which a diffraction angle 2θ exists in the range from 29.0° to 30.5°; a diffraction peak representing a diffraction intensity of 50 or more exists in the range of $28.0°\leq 2\theta \leq 29.5°$; a diffraction peak representing a diffraction intensity of 8 or more exists in the range of $19.0°\leq 2\theta \leq 22.0°$; a diffraction peak representing a diffraction intensity of 15 or more exists in the range of $25.0°\leq 2\theta \leq 28.0°$; a diffraction peak representing a diffraction intensity of 15 or more exists in the range of 34.5°≦2θ≦37.5°; a diffraction peak representing a diffraction intensity of 10 or more exists in the range of 40.0°≦2θ≦42.5°; and a diffraction peak representing a diffraction intensity of 10 or more exists in the range of 13.0°≦2θ≦15.0°. As can be seen from this, both of Phosphor 1 and Phosphor 2 belong to the same crystal structure.

In FIG. 8, a diffraction peak, which cannot be seen in the initial model, can be seen near 2θ=21.7°. As a result of qualitative analysis using X-ray diffraction, it was seen that this diffraction peak (indicated by an arrow in the figure) is derived from Cristobalite. From this point, it can be seen that Phosphor 2 includes impurities, but the crystal structure thereof belongs to the same crystal structure as the host crystal or Phosphor 1. The composition ratios (values of a and b in the formula) of Phosphors 1 to 4 were measured and determined on the basis of data about the aforementioned crystal structure of the host crystal, using an electronic probe micro analyzer (manufactured by Japan Electronics: JOEL JXA-8800R).

<Assessment Result of Phosphors 1 to 4>

An integral light emitting intensity was measured under excitation of 400 nm, with respect to Phosphors 1 to 4 and Comparative Phosphor 1. A measurement result is shown as relative values in Table 3, where the intensity of Phosphor 1 is 100. Integral light emitting intensity ratio is represented as a relative value when the integral light emitting intensity ratio of the phosphor of Comparative Example 1 is 100.

TABLE 3

|  | Integral light emitting intensity ratio | Light emitting peak wavelength (nm) |
|---|---|---|
| Phosphor 1 | 143 | 587 |
| Phosphor 2 | 191 | 579 |
| Phosphor 3 | 180 | 579 |
| Phosphor 4 | 190 | 579 |
| Comparative Example 1 | 100 | 515 |

As shown in Table 3, Phosphors 1 to 4 represent integral light emitting intensities 1.4 times or more that of Comparative Phosphor 1. Thus, Phosphors 1 to 4 are efficiently excited in a wavelength band near 400 nm to emit visible light with high light emitting intensity.

In the mixing ratio of raw materials, Phosphors 2 to 4 in which cristobalite is generated in the phosphor by excessively adding $SiO_2$ represent a better light emitting property than Phosphor 1.

Figure 9:
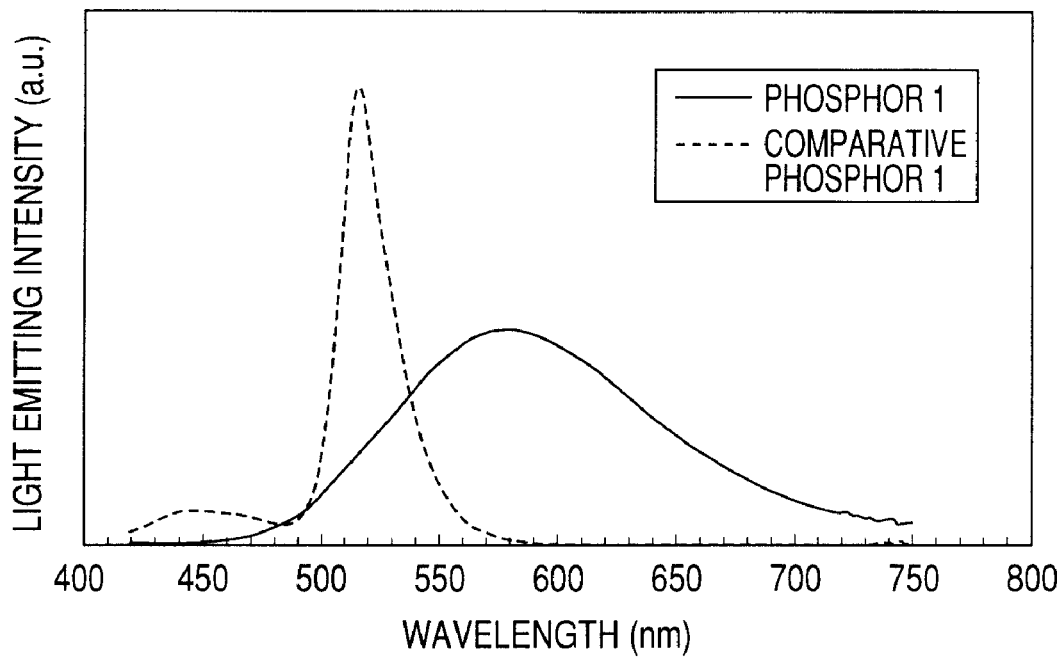
FIG. 9 is a diagram illustrating a light emitting spectrum (solid line) of Phosphor 1 and a light emitting spectrum (dotted line) of Comparative Phosphor 1.

FIG. 9 shows a light emitting spectrum (solid line) of Phosphor 1 and a light emitting spectrum (dotted line) of Comparative Phosphor 1 under excitation of 400 nm.

Figure 10:
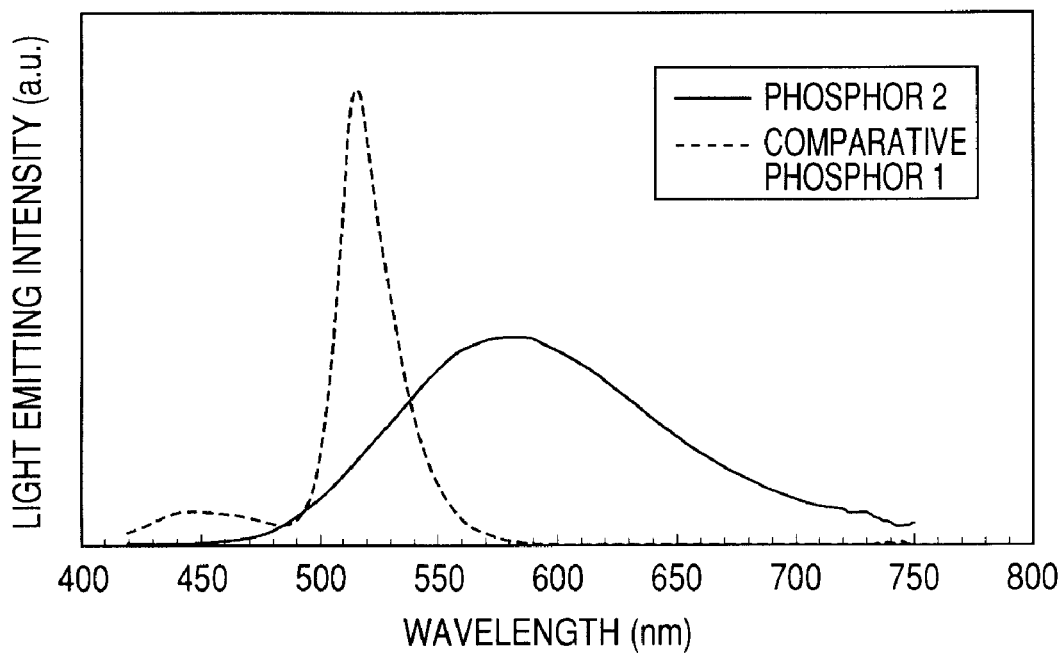
FIG. 10 is a diagram illustrating a light emitting spectrum (solid line) of Phosphor 2 and a light emitting spectrum (dotted line) of Comparative Phosphor 1.

FIG. 10 shows a light emitting spectrum (solid line) of Phosphor 2 and a light emitting spectrum (dotted line) of Comparative Phosphor 1 under excitation of 400 nm.

Figure 11:
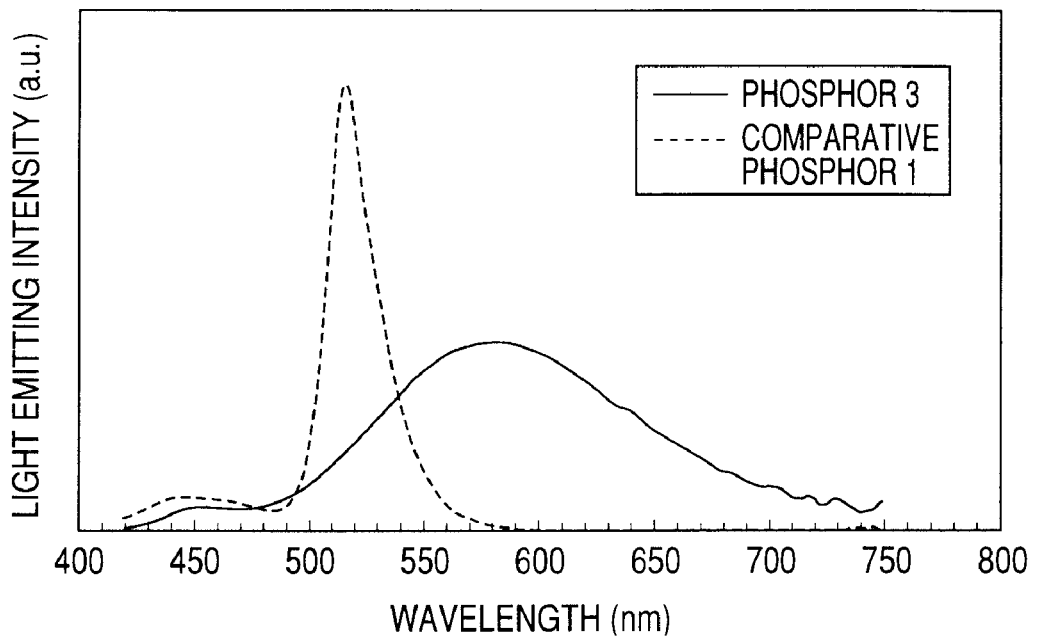
FIG. 11 is a diagram illustrating a light emitting spectrum (solid line) of Phosphor 3 and a light emitting spectrum (dotted line) of Comparative Phosphor 1.

FIG. 11 shows a light emitting spectrum (solid line) of Phosphor 3 and a light emitting spectrum (dotted line) of Comparative Phosphor 1 under excitation of 400 nm.

Figure 12:
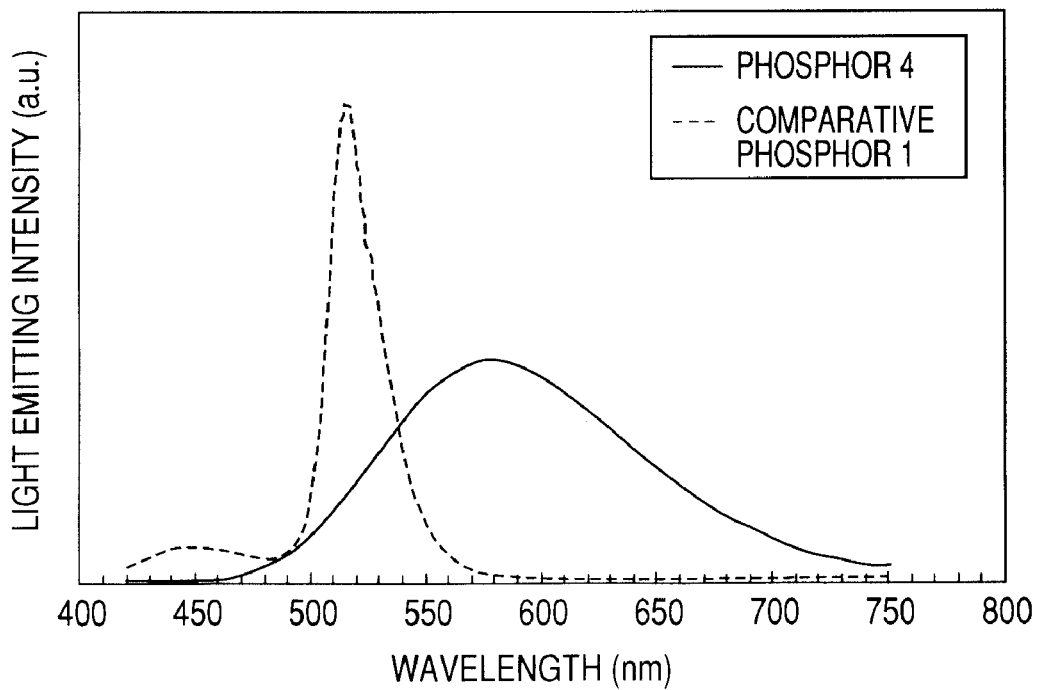
FIG. 12 is a diagram illustrating a light emitting spectrum (solid line) of Phosphor 4 and a light emitting spectrum (dotted line) of Comparative Phosphor 1.

FIG. 12 shows a light emitting spectrum (solid line) of Phosphor 4 and a light emitting spectrum (dotted line) of Comparative Phosphor 1 under excitation of 400 nm.

A vertical axis of the graphs shown in FIGS. 9 to 12 denotes a relative light emitting intensity of Phosphors 1 to 4 and Comparative Phosphor.

As shown in FIGS. 9 to 12, Phosphors 1 to 4 have peaks of the light emitting spectrum in a wavelength band of 560 to 590 nm, and half-value widths thereof are 100 nm or more.

Accordingly, Phosphors 1 to 4 can emit broad visible light with a high color rendering property.

Figure 13:
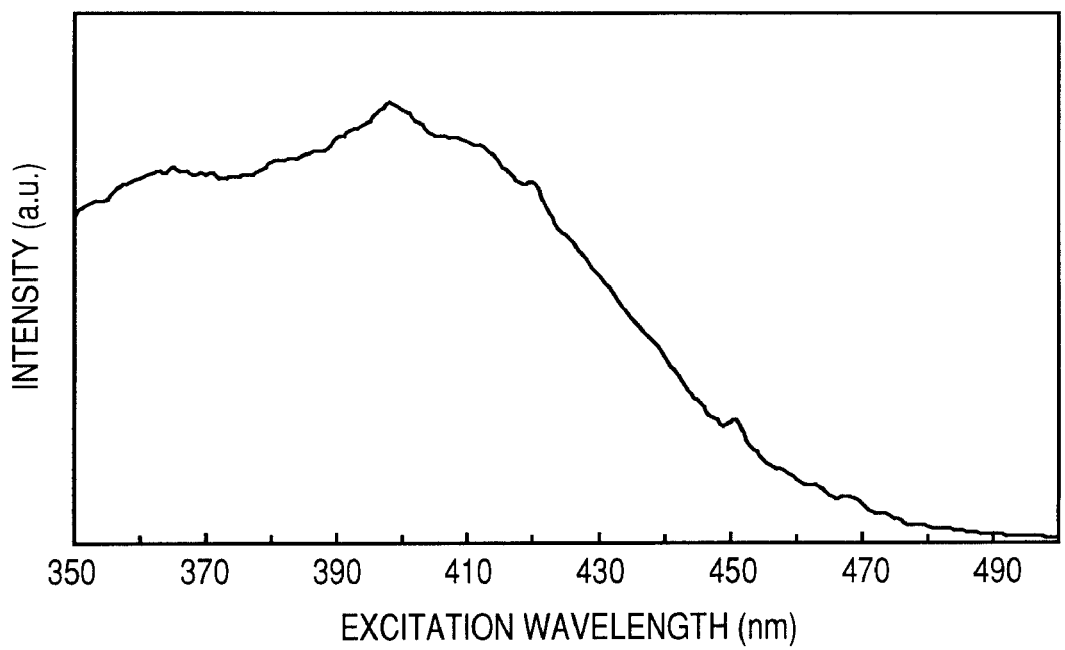
FIG. 13 is a diagram illustrating an excitation spectrum of Phosphor 1.

In FIG. 13, an excitation spectrum of Phosphor 1 is shown. As shown in FIG. 13, in Phosphor 1, a peak of an excitation spectrum is in a wavelength band of 350 to 430 nm. Thus, Phosphor 1 is efficiently excited in a wavelength band near 400 nm.

As shown in FIG. 13, Phosphor 1 hardly absorbs light in a wavelength band of 450 to 480 nm. Thus, in a case of combining Phosphor 1 with another phosphor emitting light in the wavelength band of 450 to 480 nm, for example, in case of combining Phosphor 1 with a blue light emitting phosphor to form a white light emitting device, it is possible to configure a light emitting device having high light emitting efficiency and small color shift since Phosphor 1 does not absorb light emitted by a blue phosphor.

<Assessment Result of Phosphor 5>

As a result of measuring an integral light emitting intensity with respect to Phosphor 5 and Comparative Phosphor 2, under excitation of 400 nm, a relative value of the integral light emitting intensity of Phosphor 5 was 141 assuming that the intensity of Comparative Example 2 was set to 100.

Figure 14:
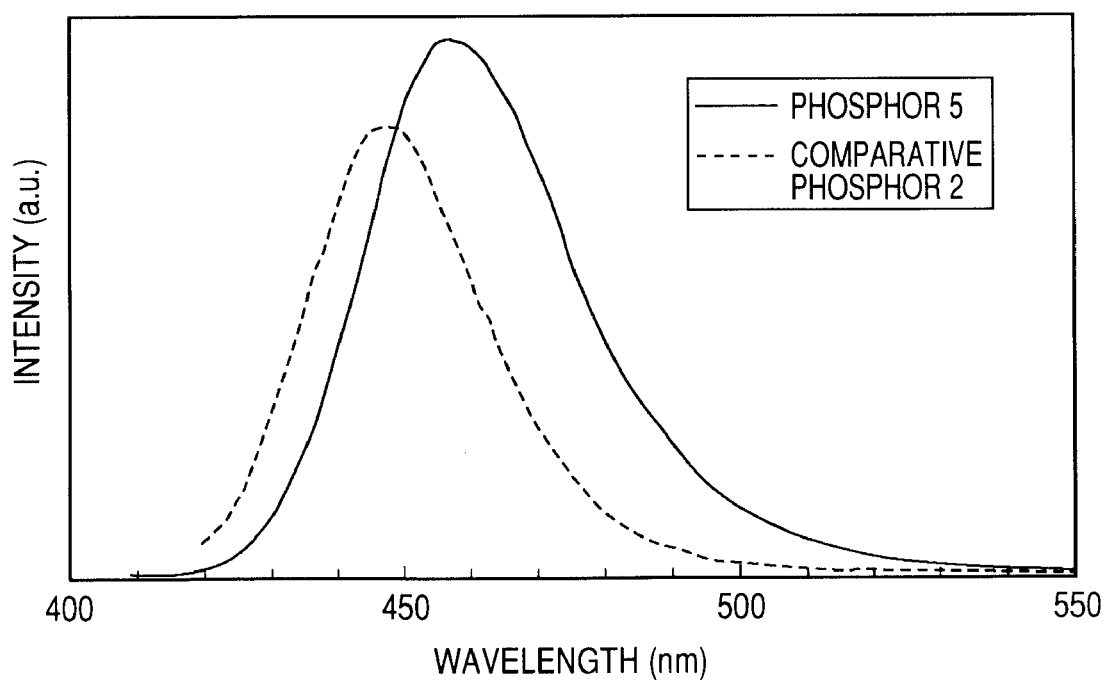
FIG. 14 is a diagram illustrating a light emitting spectrum (solid line) of Phosphor 5 and a light emitting spectrum (dotted line) of Comparative Phosphor 2.

FIG. 14 shows a light emitting spectrum (solid line) of Phosphor 4 and a light emitting spectrum (dotted line) of Comparative Phosphor 2, under excitation of 400 nm.

As shown in FIG. 14, Phosphor 4 has a better light emitting intensity than that of Comparative Phosphor 2. In addition, a half-value width of a light emitting spectrum of Phosphor 5 is 38 nm, which is broad. Accordingly, it is expected to configure a white light emitting device having a high color rendering property using Phosphor 5. That is, a half-value width of a light emitting spectrum of an LED emitting blue light is about 20 nm, but in a white light emitting device using the aforementioned method of combining an LED emitting blue light and a phosphor emitting a yellow light, it is possible to obtain a broader blue light by the white light emitting device using Phosphor 4 of the invention as a light source of blue light, and thus a high cooler rendering property is expected.

Figure 15:
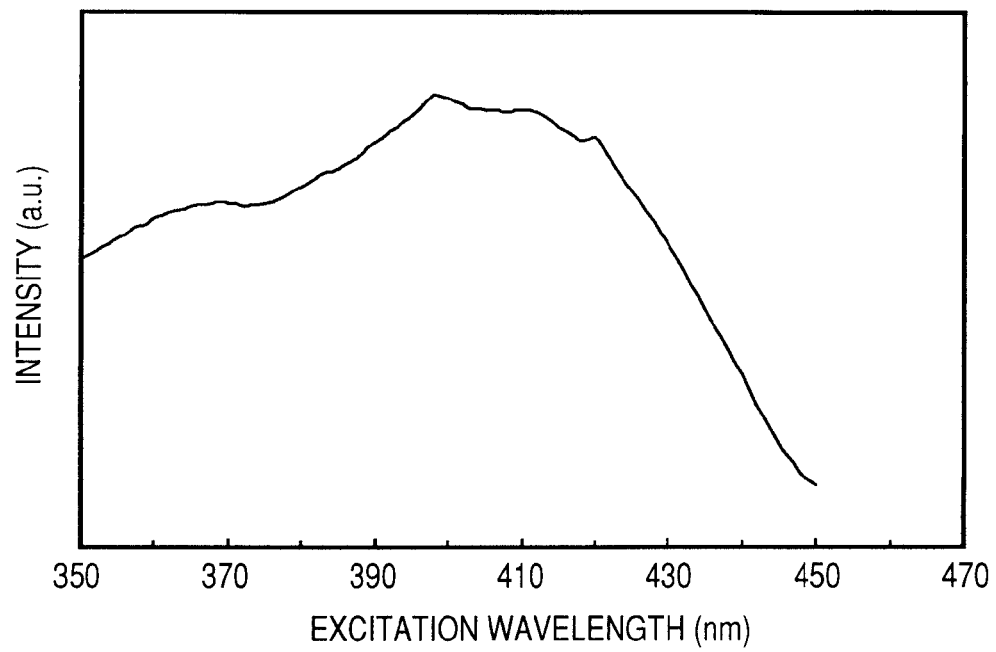
FIG. 15 is a diagram illustrating an excitation spectrum of Phosphor 5.

In FIG. 15, an excitation spectrum of Phosphor 5 is shown. As shown in FIG. 15, Phosphor 5 is efficiently excited by light in a wavelength band of 380 to 430 nm.

Next, the configuration of the light emitting device according to an exemplary embodiment of the present invention will be described.

<Configuration of Light Emitting Device (Type 1)>

In the light emitting devices of Examples 1a to 1c and Examples 2a to 2d, the following configurations are used in the first exemplary embodiment.

In addition, the following configurations of the light emitting devices are the same as those in Examples 1a to 1c, Examples 2a to 2d, Reference 1, and Comparative Example 1, except for the kinds of the phosphors.

First, an aluminum nitride substrate is used as the substrate 2, and an electrode 3a (anode) and an electrode 3b (cathode) were formed using gold, on the aluminum nitride substrate. Also, an LED of 1 mm-square size (manufactured by Semi-LEDs Inc.: MvpLED™SL-V-U40AC) whose light emitting peak is about 405 nm was used as the semiconductor light emitting element 4, the lower surface of the LED was bonded onto a silver paste (manufactured by ABLESTIK Inc.: 84-1LMISR4) dropped on the electrode 3a (anode) using a dispenser, and then the silver paste was cured at the temperature of 175° C. for 1 hour. A gold wire of Φ45 μm was used as the wire 6, and the gold wire was bonded to the upper electrode of the LED and the electrode 3b (cathode) by ultrasonic thermal compression.

Silicone resin (manufactured by Dow Corning Toray Silicon Inc.: JCR6140) was used as a binder member, and a phosphor paste was formed by mixing the silicone resin with various kinds of phosphors or a mixture of various kinds of phosphors such that mixing ratio is 30 vol %. The phosphor paste was applied onto the upper surface of the semiconductor light emitting element 4 such that the thickness of the phosphor paste is 100 μm. Then, the phosphor paste was subjected to a stepwise cure process at the temperature of 80° C. for 40 minutes, and then at the temperature of 150° C. for 60 minutes, thereby obtaining a phosphor layer 7.

The following Examples 1a to 1c, Examples 2a to 2d, Reference 1, and Comparative Example 1 were produced on the basis of the configuration of the aforementioned phosphors and light emitting device (type 1).

EXAMPLES 1a to 1d

In Examples 1a to 1d, Phosphors 1 to 4 were used as the first phosphor. As shown in Table 4, using Phosphor 1 in Example 1a, using Phosphor 2 in Example 1b, using Phosphor 3 in Example 1c, and using Phosphor 4 in Example 1d, the phosphor pastes were produced. The light emitting devices according to Examples 1a to 1d were manufactured using these phosphor pastes.

EXAMPLES 2a to 2d

In Examples 2a to 2d, Phosphor 2 was used as the first phosphor, and Phosphor 5 was used as the second phosphor. The phosphor pastes were produced using a mixture of Phosphor 2 and Phosphor 5 at a combination ratio (weight ratio) shown in Table 4, and light emitting devices according to Examples 2a to 2d were manufactured using these phosphor pastes.

<Reference 1>

The phosphor paste was produced using only Phosphor 5 as Reference 1, and a light emitting device according to Reference 1 was manufactured using this phosphor paste.

TABLE 4

| | combination ratio (weight ratio) | | | | |
|---|---|---|---|---|---|
| | Phosphor 1 | Phosphor 5 | Phosphor 2 | Phosphor 3 | Phosphor 4 |
| Example 1a | 100 | 0 | 0 | 0 | 0 |
| Example 1b | 0 | 0 | 100 | 0 | 0 |
| Example 1c | 0 | 0 | 0 | 100 | 0 |
| Example 1d | 0 | 0 | 0 | 0 | 100 |
| Example 2a | 0 | 30 | 70 | 0 | 0 |
| Example 2b | 0 | 35 | 65 | 0 | 0 |
| Example 2c | 0 | 40 | 60 | 0 | 0 |
| Example 2d | 0 | 45 | 55 | 0 | 0 |
| Reference 1 | 0 | 100 | 0 | 0 | 0 |

COMPARATIVE EXAMPLE 1

The phosphor paste was used in which a phosphor $BaMgAl_{10}O_{17}$:Eu (blue), a phosphor $BaMgAl_{10}O_{17}$:Eu,Mn (green), and a phosphor $La_2O_2S$:Eu (Red) were mixed at a combination ratio (weight ratio) of 3 (blue):12 (green):85 (red), and a light emitting device according to Comparative Example 1 was manufactured using this phosphor paste.

EVALUATION METHOD OF EXAMPLES 1a TO 1d AND EXAMPLES 2a TO 2d

The light emitting devices were allowed to emit light by applying electric current of 10 mA in an integrating sphere, and then light emitting flux ratios and spectrums were measured by a spectroscope (manufactured by Instrument System Inc.: CAS140B-152). The measurement result is described below.

Table 5 shows light emitting flux ratios, chromaticity coordinates (cx, cy), color temperatures (K), and average color rendering coefficients (Ra), upon applying the driving current of 10 mA to the light emitting devices.

The light emitting flux ratio is a relative value, assuming that light flux is 100 at the time of applying the driving current of 10 mA to the light emitting device of Comparative Example 1.

TABLE 5

| | light emitting flux ratios | chromaticity coordinates (cx, cy) | color temperatures (K) | average color rendering coefficients (Ra) |
|---|---|---|---|---|
| Example 1a | 606 | 0.48, 0.49 | 2904 | 63.1 |
| Example 1b | 780 | 0.48, 0.48 | 2932 | 64.4 |
| Example 1c | 703 | 0.49, 0.48 | 2862 | 63.7 |
| Example 1d | 734 | 0.48, 0.47 | 2888 | 66.8 |
| Example 2a | 737 | 0.42, 0.42 | 3333 | 71.7 |
| Example 2b | 727 | 0.41, 0.39 | 3517 | 74.5 |
| Example 2c | 681 | 0.38, 0.36 | 3877 | 79.4 |
| Example 2d | 692 | 0.35, 0.33 | 4522 | 83.9 |
| Reference 1 | 249 | 0.15, 0.08 | — | — |
| Comparative Example 1 | 100 | 0.38, 0.34 | 3744 | 22.8 |

As can be seen from Table 5, the light emitting device of each Example has more than six times as high light flux as that in Comparative Example 1.

It can be seen that each Example has a high color rendering property of Ra 60 or more. However, a color rendering property of Comparative Example 1 is Ra 22.8. Particularly, it can be seen that Examples 2a to 2d using the mixture of Phosphor 1 and Phosphor 4 have a high color rendering property of Ra 70 or more.

Figure 16:
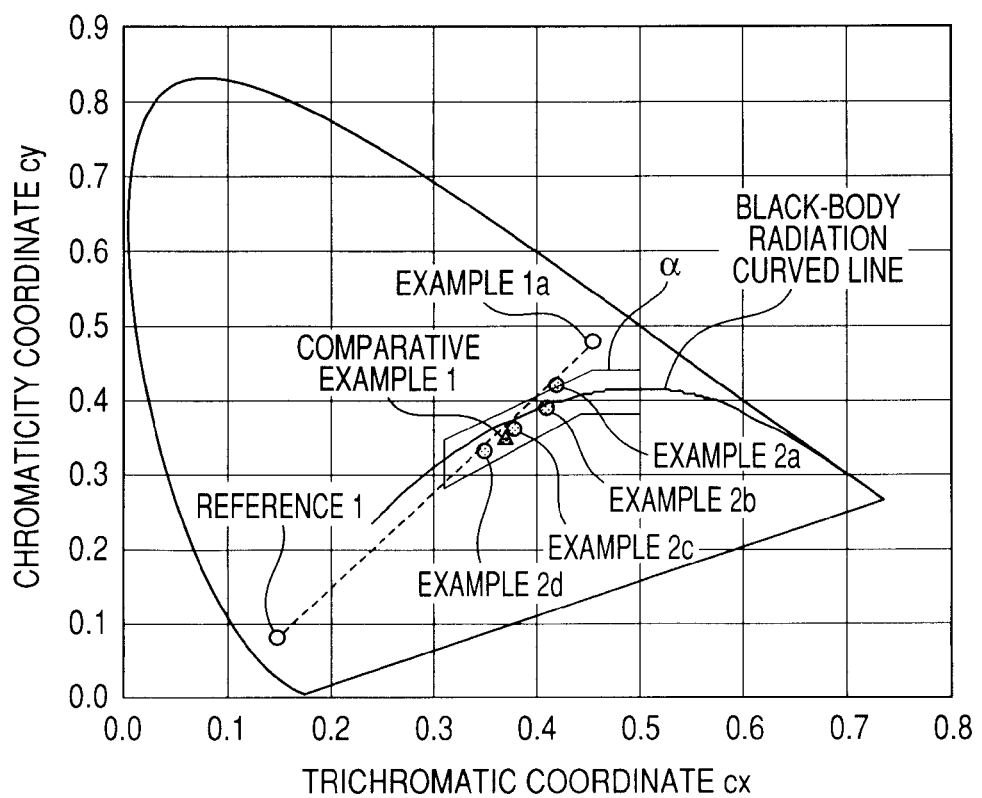
FIG. 16 is a chromaticity diagram illustrating chromaticity coordinates of emitting light of the Examples.

In FIG. 16, chromaticity coordinates (cx, cy) of light emitted when applying the driving current of 10 mA to the light emitting devices are shown on a chromaticity diagram. In the figure, a region represented as a denotes a region of white color regulation (JIS-D-5500) of a vehicle lamp.

As can be seen from Table 5, a chromaticity coordinate of Example 1b using only the first phosphor (Phosphor 2) is positioned in a yellow region, and a chromaticity coordinate of Reference 1 using only the second phosphor (Phosphor 5) is positioned in a blue region.

It can be seen that chromaticity coordinates of Examples 2a to 2d using the mixture of the first phosphor (Phosphor 2) and the second phosphor (Phosphor 5) are substantially linearly positioned between the chromaticity coordinate of Example 1b and the chromaticity coordinate of Reference 1. This is because light of both phosphors are mixed with each other. In addition, it can be seen that the chromaticity coordinates of Examples 2a to 2d are positioned in a white region, and color temperatures are positioned from a warm white region to daylight color region of 3000 to 4600 K. This is because Phosphor 2 and Phosphor 5 are in complementary-color relationship with each other.

Figure 17:
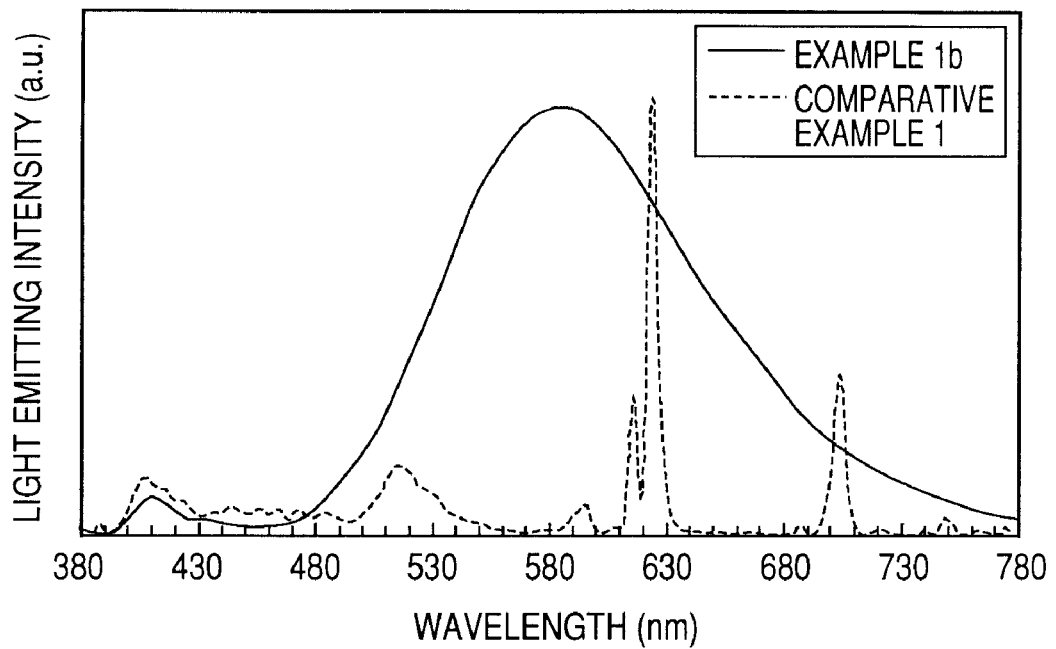
FIG. 17 is diagram illustrating a light emitting spectrum (solid line) of Example 1b of the present invention and a light emitting spectrum (dotted line) of Comparative Example 1.

In view of the above, the combination ratio of the first phosphor and the second phosphor is adjusted, so that it is possible to obtain a light emitting device having light colors with desired chromaticity coordinates on a straight line connecting the chromaticity coordinates of light colors of both phosphors FIG. 17 shows a light emitting spectrum (solid line) of Example 1b and a light emitting spectrum (dotted line) of Comparative Example 1 when applying the driving current of 10 mA to the light emitting devices of Example 1b and Comparative Example 1. A vertical axis of the graph shown in FIG. 17 denotes a relative light emitting intensity between Example 1b and Comparative Example 1. As can be seen from FIG. 17, the light emitting device of Example 1b denotes a light emitting spectrum broader than that of Example 1, and has a high color rendering property.

Figure 18:
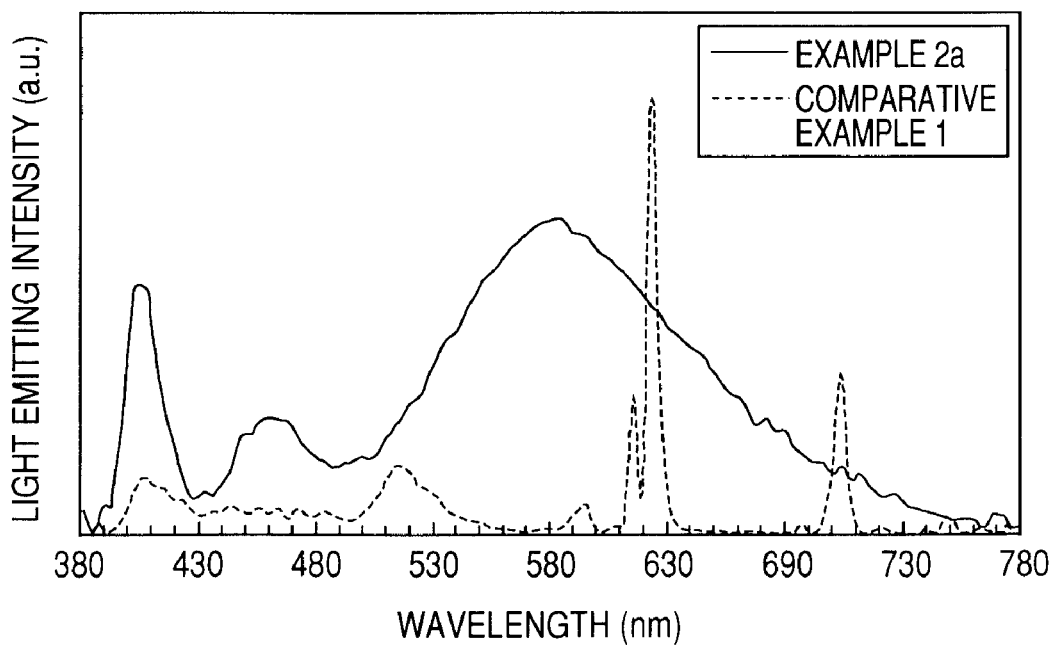
FIG. 18 is diagram illustrating a light emitting spectrum (solid line) of Example 2a of the present invention and a light emitting spectrum (dotted line) of Comparative Example 1.

FIG. 18 shows a light emitting spectrum (solid line) of Example 2a and a light emitting spectrum (dotted line) of Comparative Example 1 when applying the driving current of 10 mA to the light emitting devices of Example 2a and Comparative Example 1.

Figure 19:
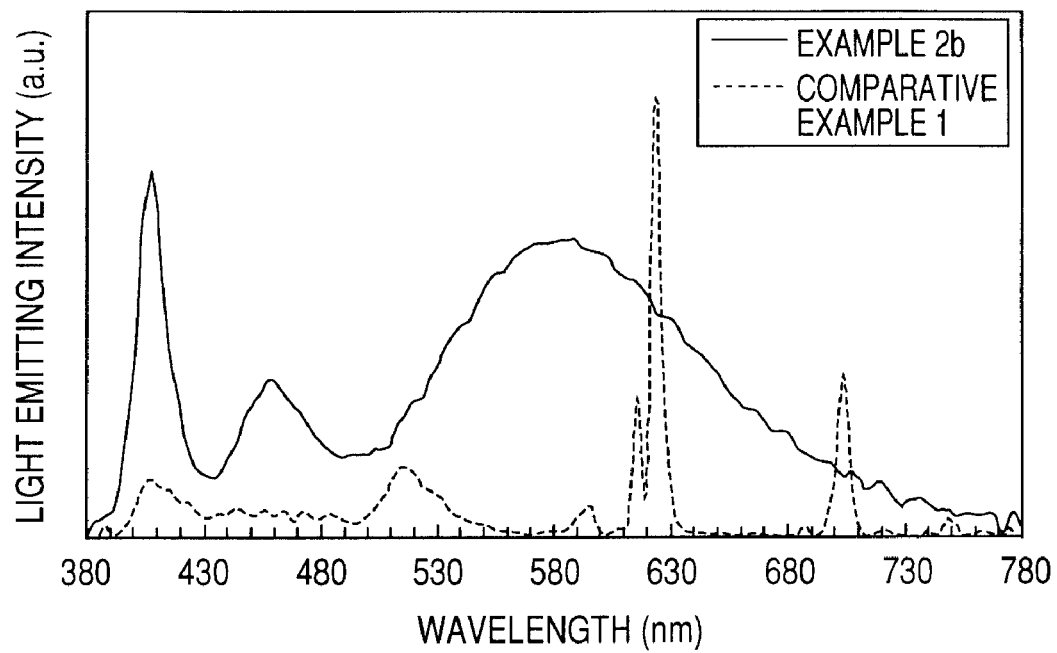
FIG. 19 is diagram illustrating a light emitting spectrum (solid line) of Example 2b of the present invention and a light emitting spectrum (dotted line) of Comparative Example 1.

FIG. 19 shows a light emitting spectrum (solid line) of Example 2b and a light emitting spectrum (dotted line) of Comparative Example 1 when applying the driving current of 10 mA to the light emitting devices of Example 2b and Comparative Example 1.

Figure 20:
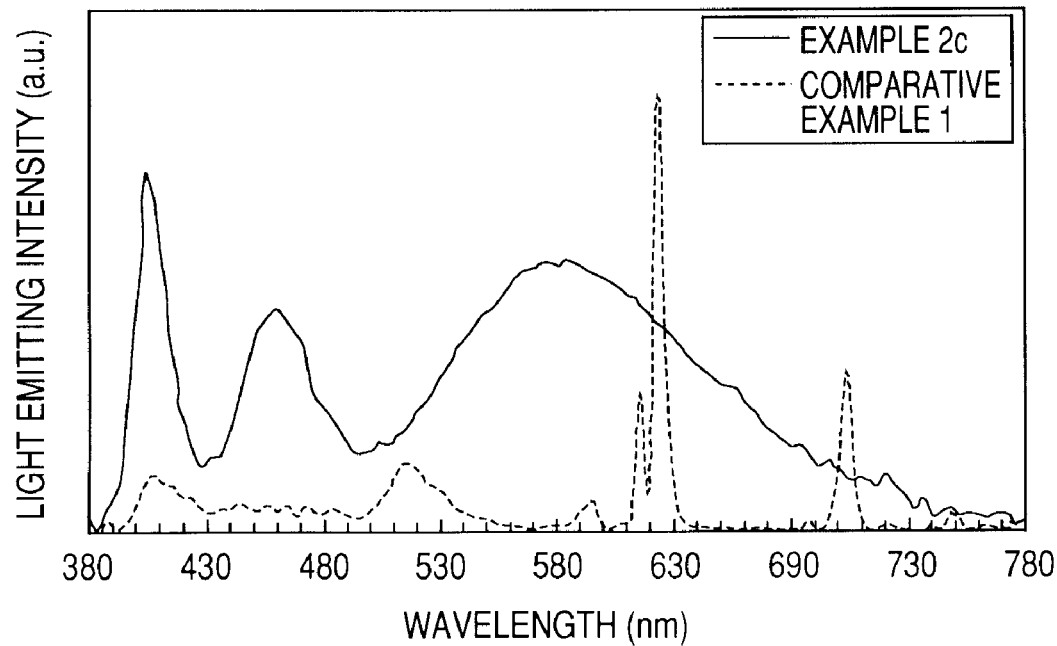
FIG. 20 is diagram illustrating a light emitting spectrum (solid line) of Example 2c of the present invention and a light emitting spectrum (dotted line) of Comparative Example 1.

FIG. 20 shows a light emitting spectrum (solid line) of Example 2c and a light emitting spectrum (dotted line) of Comparative Example 1 when applying the driving current of 10 mA to the light emitting devices of Example 2c and Comparative Example 1.

Figure 21:
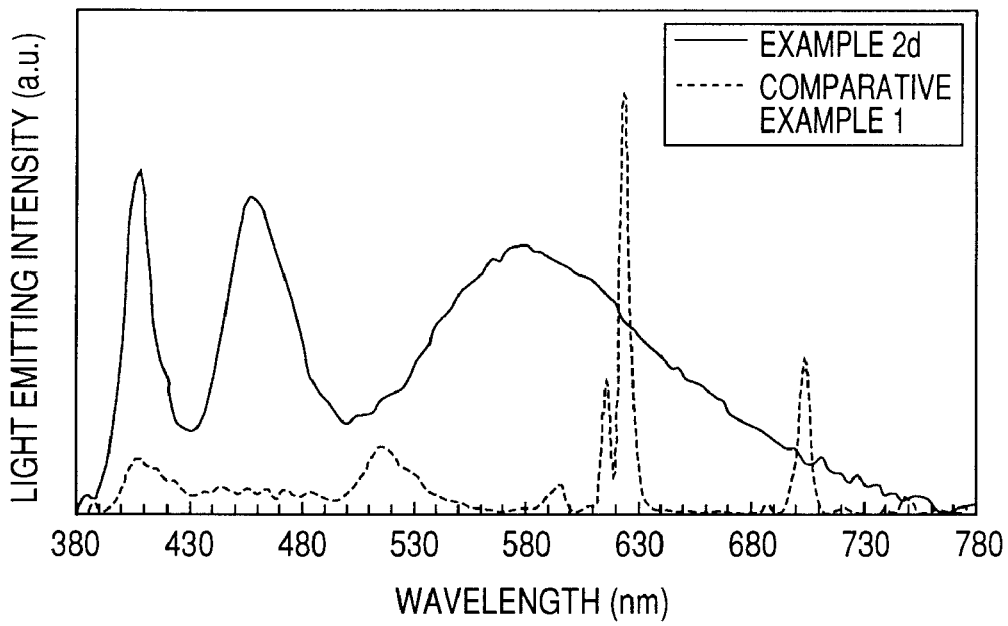
FIG. 21 is diagram illustrating a light emitting spectrum (solid line) of Example 2d of the present invention and a light emitting spectrum (dotted line) of Comparative Example 1.

FIG. 21 shows a light emitting spectrum (solid line) of Example 2d and a light emitting spectrum (dotted line) of Comparative Example 1 when applying the driving current of 10 mA to the light emitting devices of Example 2d and Comparative Example 1.

Vertical axes of the graphs shown in FIGS. 18 to 21 denote a relative light emitting intensity between Examples 2a to 2d and Comparative Example 1, respectively.

As can be seen from FIGS. 18 to 21, the light emitting devices of Examples 2a to 2d represent a light emitting spectrum broader than that of Comparative Example 1, and have a high color rendering property.

As comparing the light emitting spectrum in a wavelength band of 450 to 480 nm in FIGS. 18 to 21 with light emitting spectrum of Phosphor 4 shown in FIG. 14, peak wavelengths or half-width values of both of light emitting spectrums substantially coincide with each other. Accordingly, in the light emitting devices of Examples 2a to 2d, the light emitted from the second phosphor (Phosphor 5) is almost absorbed by the first phosphor (Phosphor 2).

<Configuration of Light Emitting Device (Type 2)>

The light emitting devices of Examples 3a to 3g use the following configurations in the third exemplary embodiment of the present invention. In addition, the configurations of the following light emitting devices are the same as those in Examples 3a to 3h and Comparative examples 2a to 2h, except for the kinds of the phosphors.

First, as the container body 13, a cup-shaped mold was formed in which electrode terminals 10a and 10b made of copper are integrated by insert molding using polyphtalamide resin. Next, an LED of 1 mm square size (manufactured by SemiLEDs Inc.: MvpLED™SL-V-U40AC) whose light emitting peak is about 405 nm was used as the semiconductor light emitting element 4. The lower surface of the LED was bonded to a silver paste (manufactured by ABLESTIK Inc.: 84-1LMISR4) dropped on the electrode terminal 10a (anode) formed on the bottom of the cup-shaped mold, and then the silver paste was cured at the temperature of 175° C. for 1 hour.

A gold wire of Φ45 μm was used as the wire 6, and the gold wire was bonded to the upper electrode of the LED and the electrode 10b (cathode) by ultrasonic thermal compression. The LED was covered with silicone resin (manufactured by Dow Corning Toray Silicon Inc.: JCR6140) as a filling member, and a potting process was performed up to the position to be same level as the upper surface of the container body 13. Then, the silicone resin was subjected to a stepwise curing process at the temperature of 80° C. for 40 minutes, and then at the temperature of 150° C. for 60 minutes. Then, silicone resin (manufactured by Dow Corning Toray Silicon Inc.: JCR6140) was used as a binder member, and a phosphor paste was produced by mixing the silicone resin with various kinds of phosphors or a mixture of plural kinds of phosphors such that mixing ration is 30 vol %.

The phosphor paste was applied onto a glass substrate as the transparent plate 13 using a spin coater by any thickness, and then the phosphor paste was cured at the temperature of 150° C. for 60 minutes, thereby forming a phosphor layer 7. Lastly, the glass substrate was fixed to the upper surface of the cup-shaped mold.

The following Examples 3a to 3h, and Comparative Examples 2a to 2h were produced on the basis of the configuration of the aforementioned phosphors and light emitting device (type 2).

EXAMPLES 3a to 3h

In Examples 3a to 3h, Phosphor 2 was used as the first phosphor, and Phosphor 5 was used as the second phosphor. The phosphor pastes were used in which Phosphor 2 (yellow) and Phosphor 5 (blue) were mixed at a combination ratio (weight ratio) of 37 (yellow):63 (blue). These phosphor pastes were applied using a spin coater with the individual spinning numbers and thicknesses shown in Table 6, thereby forming Phosphor layers 7. Thus, the light emitting devices of Examples 3a to 3h were manufactured.

COMPARATIVE EXAMPLES 2a to 2h

The phosphor pastes were used in which a phosphor (Sr, Ba, Ca)$_2$SiO$_4$:Eu$^{2+}$ (yellow) (hereinafter, referred to as Comparative Phosphor 2) and Phosphor 5 (blue) were mixed at a combination ratio (weight ratio) of 27 (yellow):73 (blue). These phosphor pastes were applied using a spin coater with the individual spinning numbers and thicknesses shown in Table 6, thereby forming Phosphor layers 7. Thus, the light emitting devices of Comparative Examples 2a to 2h were manufactured.

EVALUATION METHOD OF EXAMPLES 3a to 3h

The light emitting devices were allowed to emit light by applying electric current of 10 mA in an integrating sphere, and then were measured by an instant multi photometry system (manufactured by Otsuka Electronics Inc.: MCPD-1000) disposed over transparent plate 12. The measurement result is described below.

Table 6 shows a revolution number (rpm) of the spin coat and a thickness (μm) of the phosphor layer when forming the phosphor layers of the light emitting devices, and chromaticity coordinates (cx, cy) when applying the driving current of 10 mA to the light emitting devices.

TABLE 6

|  | revolution number of spin coat (rpm) | thickness (μm) | chromaticity coordinates (cx, cy) |
| --- | --- | --- | --- |
| Example 3a | 1000 | 252 | 0.38, 0.38 |
| Example 3b | 2000 | 113 | 0.35, 0.34 |

TABLE 6-continued

| | revolution number of spin coat (rpm) | thickness (μm) | chromaticity coordinates (cx, cy) |
|---|---|---|---|
| Example 3c | 2500 | 87 | 0.35, 0.33 |
| Example 3d | 3000 | 77 | 0.35, 0.33 |
| Example 3e | 3500 | 69 | 0.35, 0.33 |
| Example 3f | 4000 | 66 | 0.35, 0.32 |
| Example 3g | 5000 | 58 | 0.34, 0.32 |
| Example 3h | 6000 | 47 | 0.34, 0.32 |
| Comparative Example 2a | 1000 | 227 | 0.37, 0.43 |
| Comparative Example 2b | 2000 | 104 | 0.31, 0.32 |
| Comparative Example 2c | 2500 | 77 | 0.31, 0.32 |
| Comparative Example 2d | 3000 | 64 | 0.30, 0.30 |
| Comparative Example 2e | 3500 | 54 | 0.29, 0.29 |
| Comparative Example 2f | 4000 | 50 | 0.30, 0.30 |
| Comparative Example 2g | 5000 | 38 | 0.29, 0.28 |
| Comparative Example 2h | 6000 | 29 | 0.28, 0.27 |

Figure 22:
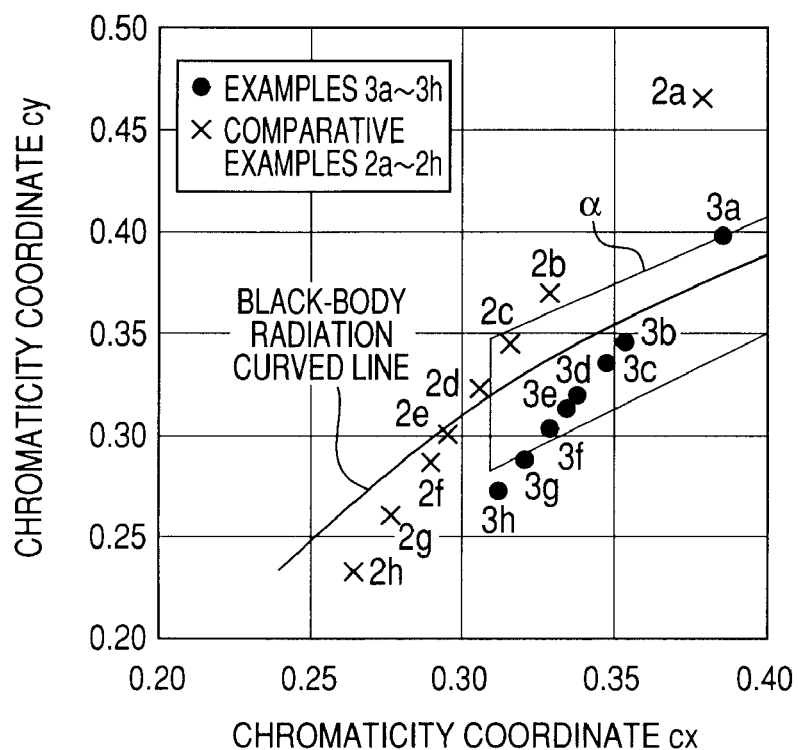
FIG. 22 is a chromaticity diagram illustrating chromaticity coordinates of emitting light of the Examples.

In FIG. 22, chromaticity coordinates (cx, cy) of light emitted when applying the driving current of 10 mA to the light emitting devices are shown on a chromaticity diagram.

As shown in Table 6 and FIG. 22, each of the Examples and Comparative Examples are shifted to a yellow color side as the thickness of the phosphor layer 7 gets lager. This is because a yellow-based phosphor (Phosphor 2, Comparative Phosphor 2) having a large stroke shift and mixed into the phosphor layer 7 absorbs light of a blue-based phosphor (Phosphor 5) and thus is converted to yellow light. The conversion amount gets larger as the phosphor layer 7 gets thicker.

Comparing the Examples with the Comparative Examples in terms of the chromaticity shift amount caused by change in thickness, a thickness difference (205 μm) between Examples 3a and 3h is almost the same as a thickness difference (198 μm) between Comparative Examples 2a and 2h. According to the thickness differences, the shift amount of chromaticity of the Examples is 0.07 and the shift amount of chromaticity of the Comparative Examples is 0.19. Thus, there is a difference of about 2.6 times in both. The is because a yellow-based phosphor (Phosphor 2) included in Phosphor 7 of the Examples has a lower excitation characteristic in a blue region than that of a yellow-based phosphor (Comparative Phosphor 2) included in Phosphor 7 of the Comparative Examples.

For this reason, according to the Comparative Examples, only a thickness range (about 30 μm) between Comparative Examples 2b and 2d is included in the region of white color regulation of vehicle lamp represented by α in FIG. 22. On the other hand, according to the Examples, a wide thickness range (about 190 μm) between Examples 3a and 3g is included in the region of white color regulation of vehicle lamp represented by α in FIG. 22. Accordingly, when a white light emitting device is configured using one of the phosphors used in the Examples, a light emitting device can be configured which has stable chromaticity even if the application amount of the phosphor is not controlled precisely. Therefore, it is possible to manufacture an inexpensive light emitting device in view of process management and product yield.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

The light emitting device of the invention is applicable to various lamps such as an illumination lamp, a display, a vehicle lamp or a signal light, etc. Particularly, it is expected that the white light emitting device of the invention is applicable to a lamp that uses high-power white light such as a vehicle headlamp.

What is claimed is:

1. A light emitting device comprising:
a light emitting element that emits ultraviolet light or short-wavelength visible light; and
at least one phosphor that is excited by the ultraviolet light or short-wavelength visible light to emit visible light, said at least one phosphor comprising a first phosphor comprising a composition represented by the formula:

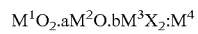

$$M^1O_2 \cdot aM^2O \cdot bM^3X_2 : M^4$$

wherein $M^1$ is at least one element selected from the group consisting of Si, Ge, Ti, Zr, and Sn; $M^2$ is at least one element selected from the group consisting of Mg, Ca, Sr, Ba, and Zn; $M^3$ is at least one element selected from the group consisting of Mg, Ca, Sr, Ba, and Zn; X is at least one halogen element; $M^4$ is at least one element essentially including $Eu^{2+}$ selected from the group consisting of rare-earth elements and Mn; a is in the range of $0.1 \leq a \leq 1.3$; and b is in the range of $0.1 \leq b \leq 0.25$.

2. A light emitting device comprising:
a light emitting element that emits ultraviolet light or short-wavelength visible light; and
at least two phosphors that are excited by the ultraviolet light or short-wavelength visible light to emit first visible light, wherein the first visible light emitted by the phosphors are in a complementary-color relation with each other and white light is obtained by adding and mixing colors of the first visible light, said at least two phosphors comprising:
a first phosphor comprising a composition represented by the formula:

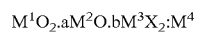

$$M^1O_2 \cdot aM^2O \cdot bM^3X_2 : M^4$$

wherein $M^1$ is at least one element selected from the group consisting of Si, Ge, Ti, Zr, and Sn; $M^2$ is at least one element selected from the group consisting of Mg, Ca, Sr, Ba, and Zn; $M^3$ is at least one element selected from the group consisting of Mg, Ca, Sr, Ba, and Zn; X is at least one halogen element; $M^4$ is at least one element essentially including $Eu^{2+}$ selected from the group consisting of rare-earth elements and Mn; a is in the range of $0.1 \leq a \leq 1.3$; and b is in the range of $0.1 \leq b \leq 0.25$; and
a second phosphor that emits second visible light that is in a complementary-color relation with the first visible light emitted from the first phosphor.

3. The light emitting device according to claim 1, wherein $M^1$ in the formula essentially comprises at least Si, and a ratio of Si is 80 mol % or more.

4. The light emitting device according to claim 1, wherein $M^2$ in the formula essentially comprises at least one of Ca and Sr, and a ratio of said at least one of Ca and Sr is 60 mol % or more.

5. The light emitting device according to claim 1, wherein $M^3$ in the formula essentially comprises at least Sr, and a ratio of Sr is 30 mol % or more.

6. The light emitting device according to claim 1, wherein X in the formula essentially comprises at least Cl, and a ratio of Cl is 50 mol % or more.

7. The light emitting device according to claim 1, wherein a peak of an excitation spectrum of the first phosphor is in a wavelength band of 350 to 430 nm.

8. The light emitting device according to claim 1, wherein a peak of a light emitting spectrum of the first phosphor is in a wavelength band of 560 to 590 nm, and a half-value width thereof is 100 nm or more.

9. The light emitting device according to claim 1, wherein according to an X-ray diffraction pattern using a Kα characteristic X-ray of Cu in at least a part of crystals included in the first phosphor, when a diffraction intensity of a highest-intensity diffraction peak is set to 100 in which a diffraction angle 2θ exists in the range from 29.0° to 30.5°, peaks having at least a diffraction intensity of 8 or more exist in the range of $28.0°\leqq 2\theta \leqq 29.5°$; in the range of $19.0°\leqq 2\theta \leqq 22.0°$; in the range of $25.0°\leqq 2\theta 28.0°$; in the range of $34.5°\leqq 2\theta \leqq 37.5°$; and in the range of $40.0°\leqq 2\theta \leqq 42.5°$.

10. The light emitting device according to claim 1, wherein according to an X-ray diffraction pattern using a Kα characteristic X-ray of Cu in at least a part of crystals included in the first phosphor, when a diffraction intensity of a highest-intensity diffraction peak is set to 100 in which a diffraction angle 2θ exists in the range from 29.0° to 30.5°, a diffraction peak having a diffraction intensity of 50 or more exists in the range of $28.0°\leqq 2\theta \leqq 29.5°$;

a diffraction peak having a diffraction intensity of 8 or more exists in the range of $19.0°\leqq 2\theta \leqq 22.0°$;

a diffraction peak having a diffraction intensity of 15 or more exists in the range of $25.0°\leqq 2\theta \leqq 28.0°$;

a diffraction peak having a diffraction intensity of 15 or more exists in the range of $34.5°\leqq 2\theta \leqq 37.5°$;

a diffraction peak having a diffraction intensity of 10 or more exists in the range of $40.0°\leqq 2\theta \leqq 42.5°$; and a diffraction peak having a diffraction intensity of 10 or more exists in the range of $13.0°\leqq 2\theta \leqq 15.0°$.

11. The light emitting device according to claim 2, wherein the second phosphor is a blue light emitting phosphor.

12. The light emitting device according to claim 2, wherein a peak of a light emitting spectrum of the second phosphor is in a wavelength band of 440 to 470 nm, and a half-value width thereof is in the range of 30 to 60 nm.

13. The light emitting device according to claim 2, wherein the second phosphor comprises a composition represented by the formula:

$$Ca_{x-y-z}Mg_y(PO_4)_3Cl:Eu^{2+}{}_z$$

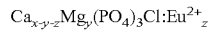

wherein x is in the range of $4.95<x<5.50$; y is in the range of $0<y<1.50$; z is in the range of $0.02<z<0.20$; and y+z is in the range of $0.02\leqq y+z \leqq 1.7$.

14. The light emitting device according to claim 1, wherein a peak of a light emitting spectrum of the light emitting element is in a wavelength band of 350 to 430 nm.

15. The light emitting device according to claim 1, wherein the light emitting element is a semiconductor light emitting element.

16. The light emitting device according to claim 15, wherein the semiconductor light emitting element is an InGaN-based light emitting diode or laser diode.

* * * * *